(12) United States Patent
Huang et al.

(10) Patent No.: US 11,417,741 B2
(45) Date of Patent: Aug. 16, 2022

(54) INTEGRATED CHIP WITH A GATE STRUCTURE OVER A RECESS

(71) Applicant: Taiwan Semiconductor Manufacturing Co., Ltd., Hsinchu (TW)

(72) Inventors: Yong-Sheng Huang, Taipei (TW); Ming Chyi Liu, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/953,921

(22) Filed: Nov. 20, 2020

(65) Prior Publication Data

US 2022/0165859 A1 May 26, 2022

(51) Int. Cl.
| | |
|---|---|
| *H01L 29/792* | (2006.01) |
| *H01L 29/423* | (2006.01) |
| *H01L 21/28* | (2006.01) |
| *H01L 27/1157* | (2017.01) |
| *H01L 29/66* | (2006.01) |

(52) U.S. Cl.
CPC .... *H01L 29/42344* (2013.01); *H01L 27/1157* (2013.01); *H01L 29/40117* (2019.08); *H01L 29/66833* (2013.01); *H01L 29/792* (2013.01)

(58) Field of Classification Search
CPC ............... H01L 27/0266; H01L 29/772; H01L 27/0281; H01L 27/10802
See application file for complete search history.

(56) References Cited

U.S. PATENT DOCUMENTS

| | | | |
|---|---|---|---|
| 7,697,328 B2 | 4/2010 | Forbes | |
| 9,960,176 B2 | 5/2018 | Wu et al. | |
| 2006/0008993 A1 | 1/2006 | Song et al. | |
| 2009/0267133 A1 | 10/2009 | Lee | |
| 2015/0041875 A1 | 2/2015 | Perera | |
| 2018/0166458 A1 | 6/2018 | Kang et al. | |

*Primary Examiner* — Mohammad M Choudhry
(74) *Attorney, Agent, or Firm* — Eschweiler & Potashnik, LLC

(57) ABSTRACT

The present disclosure relates to an integrated chip comprising a substrate having a first top surface disposed at a first height, a second top surface disposed at a second height that is less than the first height, and a connecting surface extending from the first top surface to the second top surface. A first source/drain region is disposed along the first top surface of the substrate. A second source/drain region is disposed along the second top surface of the substrate and is laterally separated from the first source/drain region by a channel region of the substrate. A gate structure is arranged between the first source/drain region and the second source/drain region. The gate structure extends from over the first top surface of the substrate to over the connecting surface of the substrate. The gate structure also extends below the first top surface of the substrate.

20 Claims, 14 Drawing Sheets

INTEGRATED CHIP WITH A GATE STRUCTURE OVER A RECESS

BACKGROUND

Flash memory is an electronic non-volatile computer storage medium that can be electrically erased and reprogrammed quickly. It is used in a wide variety of electronic devices and equipment. Common types of flash memory cells include stacked gate memory cells and split gate memory cells. Compared to stacked gate memory cells, split gate memory cells have higher injection efficiency, less susceptibility to short channel effects, and better over erase immunity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
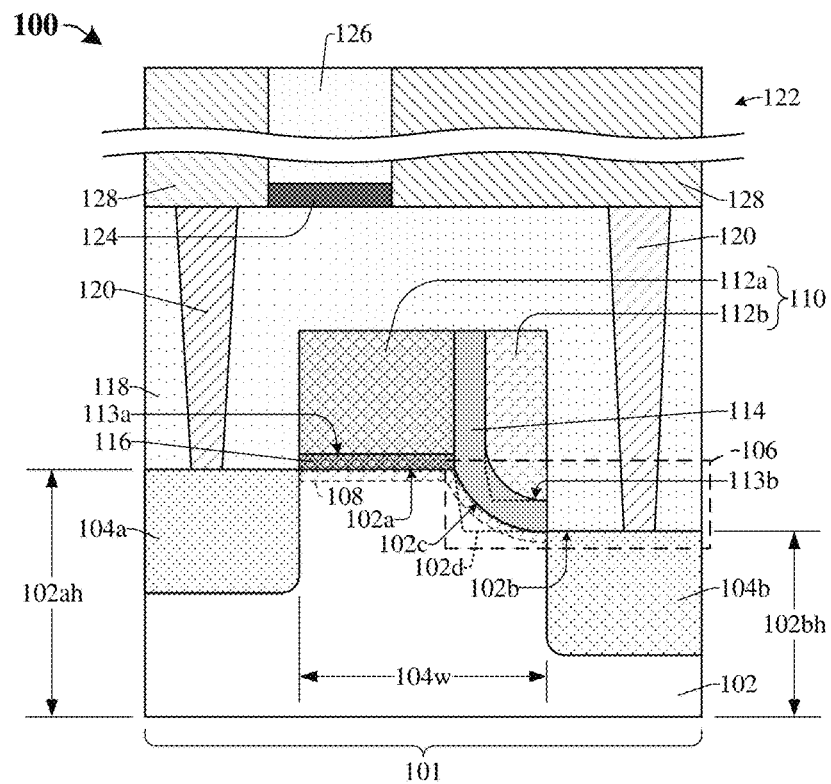
FIG. 1A illustrates a cross-sectional view of some embodiments of an integrated chip comprising a gate structure that extends over a recess in a substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many integrated chips include memory cells disposed along a substrate. For example, an integrated chip may comprise a split-gate flash memory cell disposed along a substrate. The memory cell includes a first source/drain region and a second source/drain region that are disposed along a horizontal top surface of a substrate and that are laterally separated from each other by a channel region of the substrate. A gate structure is disposed over the top surface of the substrate and is arranged between the first source/drain region and the second source/drain region. The gate structure includes a select gate (SG) and a memory gate (MG) that is laterally adjacent to the SG. The SG is vertically separated from the channel region by a SG dielectric layer and the MG is vertically separated from the channel region by a charge trapping dielectric structure. A length of the channel region is proportional to a length of the top surface of the substrate that extends between the first and second source/drain regions.

A challenge with the integrated chip is that a cell density of the integrated chip may not be increased without diminishing a performance of the memory cell. For example, because the length of the channel region is proportionate to the length of the top surface of the substrate that extends between the first and second source/drain regions, reducing the length of the top surface of the substrate that extends between the first and second source/drain regions would require reducing the length of the channel region. However, reducing the length of the channel region may negatively affect the performance of the memory cell. For example, memory cells with very short channel lengths may experience performance issues that are sometimes referred to as "short channel effects." Thus, the cell density of the integrated chip may not be increased without diminishing a performance of the memory cell.

Various embodiments of the present disclosure are related to an integrated chip including a memory cell that comprises a gate structure disposed over a recess in a substrate to increase a cell density of the integrated chip. The substrate has a first top surface disposed at a first height, a second top surface disposed at a second height that is less than the first height, and a connecting surface extending from the first top surface to the second top surface. The second top surface and the connecting surface define, at least in part, the recess in the substrate. A first source/drain region is disposed along the first top surface of the substrate. A second source/drain region is disposed along the second top surface of the substrate and is laterally separated from the first source/drain region by a channel region of the substrate. The gate structure is arranged over the substrate and between the first source/drain region and the second source/drain region. The gate structure extends from over the first top surface of the substrate to over the connecting surface of the substrate. The channel region extends along the gate structure from the first source/drain region to the second source/drain region. For example, the channel region extends laterally along the first top surface of the substrate and both vertically and laterally along the connecting surface.

Because the channel region extends laterally along the first top surface of the substrate and further extends both laterally and vertically along the connecting surface of the substrate, a lateral distance between the first source/drain region and the second source/drain region may be reduced while a length of the channel region may be maintained. For example, because a portion of the channel region extends vertically along the connecting surface of the substrate, that portion of the channel region may add length to the channel without adding to the lateral distance that is between the first source/drain region and the second source/drain region. In other words, the length of the channel region may be greater than the lateral distance between the first source/drain region and the second source/drain region. As a result, the integrated chip may include more memory cells in a given lateral distance along substrate without decreasing the lengths of the channel regions of the memory cells (i.e., a cell density of the integrated chip may be increased without diminishing a performance of the memory cells).

FIG. 1A illustrates a cross-sectional view 100 of some embodiments of an integrated chip comprising a gate structure 110 that extends over a recess 106 in a substrate 102.

The integrated chip includes a memory cell 101 along the substrate 102. The substrate 102 has a first top surface 102a disposed at a first height 102ah, a second top surface 102b disposed at a second height 102bh that is less than the first height 102ah, and a connecting surface 102c extending from the first top surface 102a to the second top surface 102b. The second top surface 102b and the connecting surface 102c define, at least in part, the recess 106 in the substrate 102.

The memory cell 101 comprises a first source/drain region 104a and a second source/drain region 104b. The first source/drain region 104a is disposed along the first top surface 102a of the substrate 102. The second source/drain region 104b is disposed along the second top surface 102b of the substrate 102 and is laterally separated from the first source/drain region 104a by a first lateral distance 104w. In some embodiments, the first source/drain region 104a is separated from the second source/drain region 104b by a channel region 108.

The gate structure 110 is arranged over the substrate 102 and between the first source/drain region 104a and the second source/drain region 104b. The gate structure 110 extends from over the first top surface 102a of the substrate 102 to over the connecting surface 102c of the substrate 102. In some embodiments, the gate structure 110 further extends to over the second top surface 102b of the substrate 102. In some embodiments, the gate structure 110 extends below the first top surface 102a of the substrate 102.

The gate structure 110 comprises a first gate 112a and a second gate 112b that is laterally adjacent to the first gate 112a. The first gate 112a extends over the first top surface 102a of the substrate 102. A first lower surface 113a of the first gate 112a is above the first top surface 102a of the substrate 102 and is vertically separated from the first top surface 102a of the substrate 102 by a gate dielectric layer 116. The second gate 112b extends over the connecting surface 102c of the substrate 102 and may further extend over the second top surface 102b of the substrate 102. A second lower surface 113b of the second gate 112b extends below the first top surface 102a of the substrate 102, extends along the connecting surface 102c of the substrate 102, and is vertically separated from the connecting surface 102c by a charge trapping dielectric structure 114. In some embodiments, the charge trapping dielectric structure 114 extends between the first gate 112a and the second gate 112b. For example, the charge trapping dielectric structure 114 may extend along a sidewall of the first gate 112a and along an opposing sidewall of the second gate 112b. In some embodiments, the charge trapping dielectric structure 114 may laterally separate the first gate 112a from the second gate 112b.

In some embodiments, a difference between the first height 102ah and the second height 102bh (e.g., a depth of the recess 106) is greater than or equal to a width (not labeled) of the second gate 112b.

The channel region 108 extends along the gate structure 110 from the first source/drain region 104a to the second source/drain region 104b. In some embodiments, the channel region 108 extends laterally along the first top surface 102a of the substrate 102 and extends both vertically and laterally along the connecting surface 102c of the substrate 102.

Because the channel region 108 extends laterally along the first top surface 102a of the substrate 102 and extends both vertically and laterally along the connecting surface 102c of the substrate 102, a length (not labeled) of the channel region 108 is greater than the first lateral distance 104w between the first source/drain region 104a and the second source/drain region 104b. In other words, the first lateral distance 104w between the first source/drain region 104a and the second source/drain region 104b may be reduced without reducing the length (not labeled) of the channel region 108. Thus, a cell density of the integrated chip may be increased without diminishing a performance of the memory cell 101.

In some embodiments, the integrated chip further comprises a first interlayer dielectric (ILD) layer 118 over the substrate 102, a plurality of contacts 120 extending through the first ILD layer 118, and an interconnect structure 122 over the plurality of contacts 120. In some embodiments, the interconnect structure 122 may, for example, comprise one or more etch-stop layers 124, one or more second ILD layers 126, one or more interconnect wires 128, one or more interconnect vias (not shown), or some other suitable features (e.g., bond pads, solder bumps, or the like).

Although the connecting surface 102c of the substrate 102 is illustrated as being curved, it will be appreciated that in some alternative embodiments, the connecting surface 102c may not be curved, and may meet the second top surface 102b of the substrate 102 at a corner, as illustrated by dashed lines 102d. Further, in such embodiments, the overlying charge trapping dielectric structure 114 and overlying second gate 112b may also have surfaces that meet at a corner. In some other alternative embodiments, the connecting surface 102c may comprise a plurality of curved surfaces, a plurality of corners, or some other suitable features.

Figure 1B:
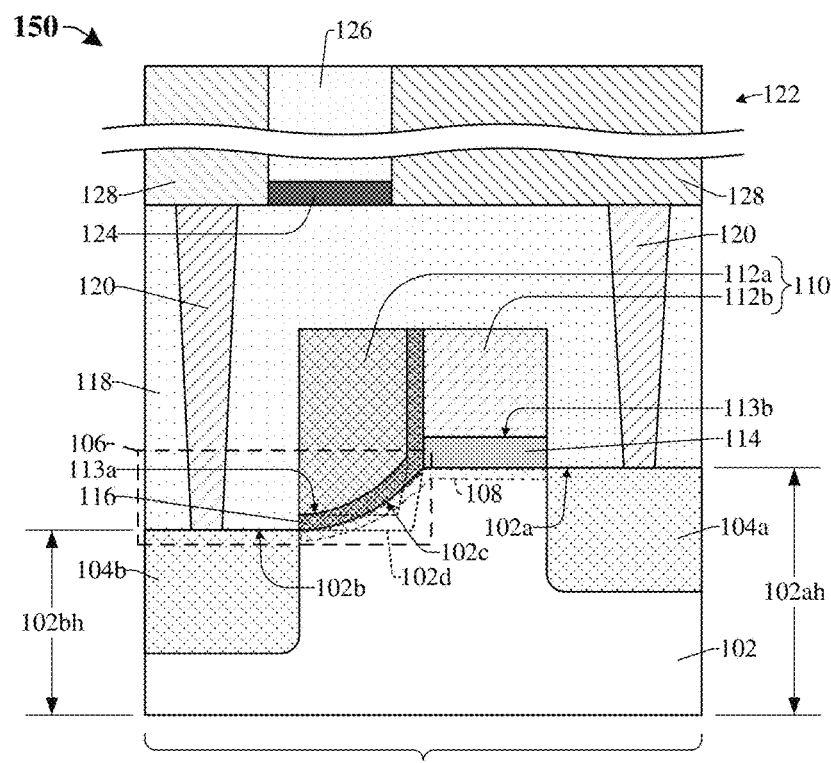
FIG. 1B illustrates a cross-sectional view of some alternative embodiments of an integrated chip comprising a gate structure that extends over a recess in a substrate.

FIG. 1B illustrates a cross-sectional view 150 of some alternative embodiments of an integrated chip comprising a gate structure 110 that extends over a recess 106 in a substrate 102.

In such embodiments, a first gate 112a extends over a connecting surface 102c of the substrate 102 and a second gate 112b extends over a first top surface 102a of the substrate 102. A second lower surface 113b of the second gate 112b is above the first top surface 102a of the substrate 102 and is vertically separated from the first top surface 102a of the substrate 102 by a charge trapping dielectric structure 114. Further, a first lower surface 113a of the first gate 112a extends below the first top surface 102a of the substrate 102, extends along the connecting surface 102c of the substrate 102, and is vertically separated from the connecting surface 102c by a gate dielectric layer 116. In some embodiments, the first gate 112a may further extend over a second top surface 102b of the substrate 102.

Further, in some embodiments, the gate dielectric layer 116 extends between the first gate 112a and the second gate 112b. For example, the gate dielectric layer 116 may extend along a sidewall of the first gate 112a and along an opposing sidewall of the second gate 112b. In some embodiments, the gate dielectric layer 116 may laterally separate the first gate 112a from the second gate 112b.

In some embodiments, a difference between the first height 102ah and the second height 102bh (e.g., a depth of the recess 106) is greater than or equal to a width (not labeled) of the first gate 112a. For example, in some embodiments, the difference between the first height 102ah and the second height 102bh (e.g., the depth of the recess 106) is in a range from about 5 nm to about 80 nm, from about 10 nm to about 45 nm, from about 20 nm to about 40 nm, or some other suitable range. In some embodiments, increasing the depth of the recess 106 may increase the cell density of the integrated chip. For example, a recess depth of about 40 nm may correspond to about a 16% increase in cell density, and a recess depth of about 45 nm may correspond to about a 18% increase in cell density.

In some embodiments, the width of the first gate 112a and/or the width of the second gate 112b may, for example, be greater than or equal to about 10 nm, may be about 10 nm to 45 nm, may be about 10 nm to 90 nm, or some other suitable value.

In some embodiments, a maximum depth of the recess 106 may depend on a width of the gate that extends over the connecting surface 102c (e.g., the first gate 112a in FIG. 1B and the second gate 112b in FIG. 1A). In some embodiments, the maximum depth of the recess 106 may, for example, be equal to the desired width of the gate that extends over the connecting surface 102c, minus 10 nm. In other words, in some embodiments, if the desired width of the gate that extends over the connecting surface 102c is about 90 nm, the maximum depth of the recess 106 may be about 80 nm.

Although the connecting surface 102c of the substrate 102 is illustrated as being curved, it will be appreciated that in some alternative embodiments, the connecting surface 102c may not be curved, and may meet the second top surface 102b of the substrate 102 at a corner, as illustrated by dashed lines 102d. Further, in such embodiments, the overlying gate dielectric layer 116 and the overlying first gate 112a may also have surfaces that meet at a corner.

In some embodiments, the substrate 102 may, for example, be or comprise silicon, some III-V material, or some other suitable semiconductor material.

In some embodiments, the first source/drain region 104a and the second source/drain region 104b may, for example, be or comprise doped regions of the substrate 102.

In some embodiments, the first gate 112a and the second gate 112b may, for example, be or comprise polysilicon, some metal, or some other suitable material. Further, in some embodiments, the first gate 112a may, for example, be a select gate (SG) and the second gate 112b may, for example, be a memory gate (MG).

In some embodiments, the charge trapping dielectric structure 114 may comprise one or more dielectric layers. Further, in some embodiments, the charge trapping dielectric structure 114 may be or comprise an oxide-nitride-oxide structure or some other suitable dielectric structure. For example, in some embodiments, the charge trapping dielectric structure 114 may comprise a first dielectric layer, a second dielectric layer over the first dielectric layer, and a third dielectric layer over the second dielectric layer. In such embodiments, the first dielectric layer and the third dielectric layer may comprise a first dielectric material while the second dielectric layer may comprise a second dielectric material different from the first dielectric material.

In some instances, the integrated chip illustrated in FIG. 1A and the integrated chip illustrated in FIG. 1B may have similar performance characteristics. In some other instances, the integrated chip illustrated in FIG. 1B may exhibit more consistent performance, more predictable performance, and/or better overall performance characteristics because the charge trapping dielectric structure 114 has a more uniform shape (e.g., flat shape) in the integrated chip illustrated in FIG. 1B than in the integrated chip illustrated in FIG. 1A. In some embodiments, the shape of the charge trapping dielectric structure 114 may affect one or more operating current(s) of the memory cell 101.

Figure 2A:
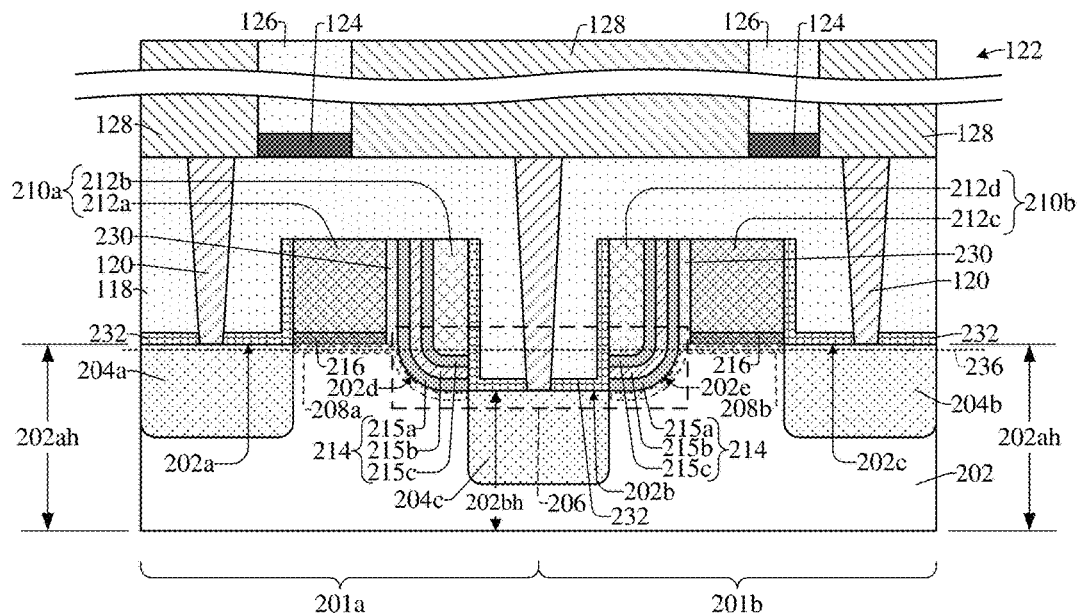
FIG. 2A illustrates a cross-sectional view of some embodiments of an integrated chip comprising a first gate structure and a second gate structure that extend over a common recess in a substrate.

FIG. 2A illustrates a cross-sectional view 200 of some embodiments of an integrated chip comprising a first gate structure 210a and a second gate structure 210b that extend over a common recess 206 in a substrate 202.

The integrated chip includes a first memory cell 201a and a second memory cell 201b along the substrate 202. The substrate 202 has a first top surface 202a and a third top surface 202c that are disposed at a first height 202ah. The substrate 202 also has a second top surface 202b that is laterally between the first top surface 202a and the third top surface 202c. The second top surface 202b is disposed at a second height 202bh that is less than the first height. The substrate 202 has a first connecting surface 202d that extends from the first top surface 202a to the second top surface 202b, and has a second connecting surface 202e that extends from the third top surface 202c to the second top surface 202b. The second top surface 202b, the first connecting surface 202d, and the second connecting surface 202e define, at least in part, the common recess 206 in the substrate 202.

The first memory cell 201a comprises a first individual source/drain region 204a that disposed along the first top surface of the substrate 202. The second memory cell 201b comprises a second individual source/drain region 204b that is disposed along the third top surface 202c of the substrate 202. Further, the first memory cell 201a and the second memory cell 201b share a common source/drain region 204c that is between the first and second individual source/drain regions 204a, 204b and that is disposed along the second top surface 202b of the substrate 202.

The first gate structure 210a is arranged over the substrate 202 and between the first individual source/drain region 204a and the common source/drain region 204c. The first gate structure 210a comprises a first gate 212a and a second gate 212b that is adjacent to the first gate 212a. The first gate 212a extends over the first top surface 202a of the substrate 202. A first lower surface (not labeled) of the first gate 212a is above the first top surface 202a of the substrate 202 and is vertically separated from the first top surface 202a of the substrate 202 by a gate dielectric layer 216. The second gate 212b extends over the first connecting surface 202d of the substrate 202 and may further extend over the second top surface 202b of the substrate 202. A second lower surface (not labeled) of the second gate 212b extends below the first top surface 202a of the substrate 202, extends along the first connecting surface 202d of the substrate 202, and is vertically separated from the first connecting surface 202d by a charge trapping dielectric structure 214.

The second gate structure 210b is arranged over the substrate 202 and between the second individual source/drain region 204b and the common source/drain region 204c. The second gate structure 210b comprises a third gate 212c and a fourth gate 212d that is adjacent to the third gate 212c. The third gate 212c extends over the third top surface 202c of the substrate 202 and the fourth gate 212d extends over the second connecting surface 202e of the substrate 202. A third lower surface (not labeled) of the third gate 212c is above the third top surface 202c of the substrate 202 and is vertically separated from the third top surface 202c of the substrate 202 by the gate dielectric layer 216. Further, a fourth lower surface (not labeled) of the fourth gate 212d extends below the third top surface 202c of the substrate 202, extends along the second connecting surface 202e of the substrate 202, and is vertically separated from the second connecting surface 202e by the charge trapping dielectric structure 214. In some embodiments, the fourth gate 212d may further extend over a second top surface 202b of the substrate 202.

In some embodiments, a horizontal plane (e.g., illustrated by dashed line 236) that is disposed at a third height (not labeled) that is between the first height 202ah and the second height 202bh intersects both the second gate 212b and the fourth gate 212d.

In some embodiments, the charge trapping dielectric structure 214 extends between the first gate 212a and the second gate 212b, and also extends between the third gate 212c and the fourth gate 212d. In some embodiments, the charge trapping dielectric structure 214 may laterally separate the first gate 212a from the second gate 212b, and may also laterally separate the third gate 212c from the fourth gate 212d.

In some embodiments, the charge trapping dielectric structure 214 comprises a tunneling layer 215a, a charge trapping layer 215b over the tunneling layer 215a, and a blocking layer 215c over the charge trapping layer 215b. In some embodiments, the tunneling layer 215a and the blocking layer 215c may comprise a first dielectric material (e.g., silicon dioxide, aluminum oxide, or some other oxide) while the charge trapping layer 215b may comprise a second dielectric material (e.g., silicon nitride, aluminum nitride, or some other nitride) different from the first dielectric material.

In some embodiments, a first channel region 208a within the substrate 202 extends along the first gate structure 210a from the first individual source/drain region 204a to the common source/drain region 204c. In some embodiments, a second channel region 208b within the substrate 202 extends along the second gate structure 210b from the second individual source/drain region 204b to the common source/drain region 204c. In some embodiments, a first length (not labeled) of the first channel region 208a is greater than a first lateral distance (not labeled) between the first individual source/drain region 204a and the common source/drain region 204c. Further, in some embodiments, a second length (not labeled) of the second channel region 208b is greater than a second lateral distance (not labeled) between the second individual source/drain region 204b and the common source/drain region 204c.

In some embodiments, a first dielectric liner layer 230 extends between the first gate 212a and the second gate 212b, and extends between the third gate 212c and the fourth gate 212d. In some embodiments, the first dielectric liner layer 230 is on a sidewall of the charge trapping dielectric structure 214, on a sidewall of the gate dielectric layer 216, and on a sidewall of the first gate 212a.

In some embodiments, a second dielectric liner layer 232 is on the first top surface 202a of the substrate 202, the second top surface 202b of the substrate 202, and the third top surface 202c of the substrate 202. In some embodiments, the second dielectric liner layer 232 extends over the first individual source/drain region 204a, over the second individual source/drain region 204b, and the common source/drain region 204c. Further, in some embodiments, the second dielectric liner layer 232 extends along a sidewall of the first gate 212a, a sidewall of the second gate 212b, a sidewall of the third gate 212c, and a sidewall of the fourth gate 212d.

Figure 2B:
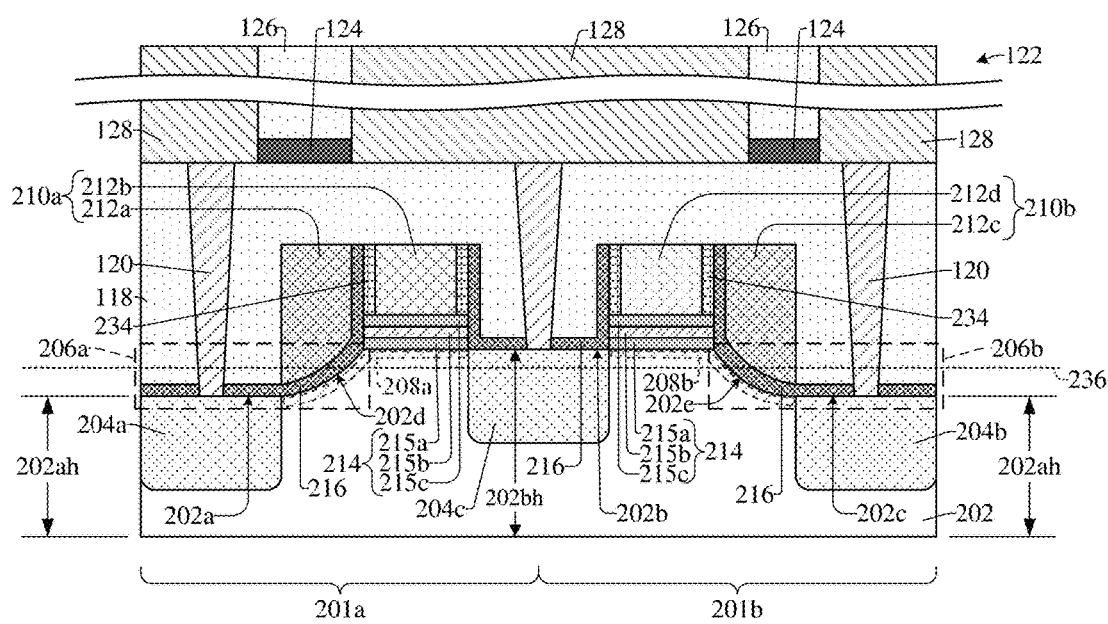
FIG. 2B illustrates a cross-sectional view of some embodiments of an integrated chip comprising a first gate structure and a second gate structure that extend over a first recess and a second recess in a substrate, respectively.

FIG. 2B illustrates a cross-sectional view 250 of some embodiments of an integrated chip comprising a first gate structure 210a and a second gate structure 210b that extend over a first recess 206a and a second recess 206b in a substrate 102, respectively.

In such embodiments, the substrate 202 has a first top surface 202a and a third top surface 202c that are disposed at a first height 202ah. The substrate 202 also has a second top surface 202b that is laterally between the first top surface 202a and the third top surface 202c and that is disposed at a second height 202bh that is greater than the first height 202ah. The first top surface 202a and the first connecting surface 202d define, at least in part, the first recess 206a in the substrate 202. The third top surface 202c and the second connecting surface 202e define, at least in part, the second recess 206b in the substrate 202.

The first gate structure 210a comprises a first gate 212a and a second gate 212b that is adjacent to the first gate 212a. The first gate 212a extends over the first connecting surface 202d of the substrate 202 and may further extend over the first top surface 202a of the substrate 202. A first lower surface (not labeled) of the first gate 212a extends below the second top surface 202b of the substrate 202, extends along the first connecting surface 202d of the substrate 202, and is vertically separated from the first connecting surface 202d by a gate dielectric layer 216. The second gate 212b extends over the second top surface 202b of the substrate 202. A second lower surface (not labeled) of the second gate 212b is above the second top surface 202b of the substrate 202 and is vertically separated from the second top surface 202b of the substrate 202 by a charge trapping dielectric structure 214.

The second gate structure 210b comprises a third gate 212c and a fourth gate 212d that is adjacent to the third gate 212c. The fourth gate 212d extends over the second top surface 202b of the substrate 202 and the third gate 212c extends over the second connecting surface 202e of the substrate 202. In some embodiments, the third gate 212c may further extend over the third top surface 202c of the substrate 202. A third lower surface (not labeled) of the third gate 212c extends below the second top surface 202b of the substrate 202, extends along the second connecting surface 202e of the substrate 202, and is vertically separated from the second connecting surface 202e by the gate dielectric layer 216. A fourth lower surface (not labeled) of the fourth gate 212d is above the second top surface 202b of the substrate 202 and is vertically separated from the second top surface 202b of the substrate 202 by the charge trapping dielectric structure 214.

In some embodiments, a horizontal plane (e.g., illustrated by dashed line 236) that is disposed at a third height (not labeled) that is between the first height 202ah and the second height 202bh intersects both the first gate 212a and the third gate 212c.

In some embodiments, the gate dielectric layer 216 extends between the first gate 212a and the second gate 212b, and further extends between the third gate 212c and the fourth gate 212d. In some embodiments, the gate dielectric layer 216 may laterally separate the first gate 212a from the second gate 212b, and may also laterally separate the third gate 212c from the fourth gate 212d. In some embodiments, the gate dielectric layer 216 is on the first top surface 202a of the substrate 202, the second top surface 202b of the substrate 202, and the third top surface 202c of the substrate 202. In some embodiments, the gate dielectric layer 216 extends over the first individual source/drain region 204a, over the second individual source/drain region 204b, and the common source/drain region 204c. In some embodiments, the gate dielectric layer 216 extends along a sidewall of the first gate 212a, a sidewall of the second gate 212b, a sidewall of the third gate 212c, and a sidewall of the fourth gate 212d.

In some embodiments, a first dielectric liner layer 234 is on opposing sidewalls of the second gate 212b and on opposing sidewalls of the fourth gate 212d. In some embodiments, the first dielectric liner layer 234 may further laterally separate the first gate 212a from the second gate 212b and the third gate 212c from the fourth gate 212d.

In some embodiments, the first gate 212a and the third gate 212c may, for example, be select gates (SGs) while the second gate 212b and the fourth gate 212d may, for example, be memory gates (MGs).

FIGS. 3-18 illustrate cross-sectional views 300-1800 of some embodiments of a method for forming an integrated chip comprising gates (e.g., 212b, 212d) that are arranged over a common recess 206 in a substrate 202. Although FIGS. 3-18 are described in relation to a method, it will be appreciated that the structures disclosed in FIGS. 3-18 are not limited to such a method, but instead may stand alone as structures independent of the method.

Figure 3:
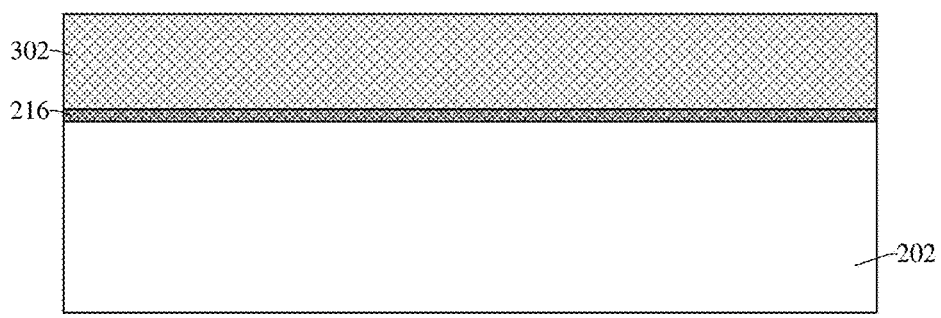
FIGS. 3-18 illustrate cross-sectional views of some embodiments of a method for forming an integrated chip comprising gates that are arranged over a common recess in a substrate.

As shown in cross-sectional view 300 of FIG. 3, a gate dielectric layer 216 is formed over a substrate 202 and a first gate layer 302 is formed over the gate dielectric layer 216. In some embodiments, the gate dielectric layer 216 may, for example, be formed by depositing silicon dioxide, aluminum oxide, hafnium oxide, some other dielectric, or some other suitable material over the substrate 202 by a chemical vapor deposition (CVD) process, a physical vapor deposition (PVD) process, an atomic layer deposition (ALD) process, a spin on process, or some other suitable process. In some embodiments, the first gate layer 302 may, for example, be formed by depositing polysilicon or some other suitable material over the substrate 202 by a CVD process, a PVD process, an ALD process, or some other suitable process.

Figure 4:
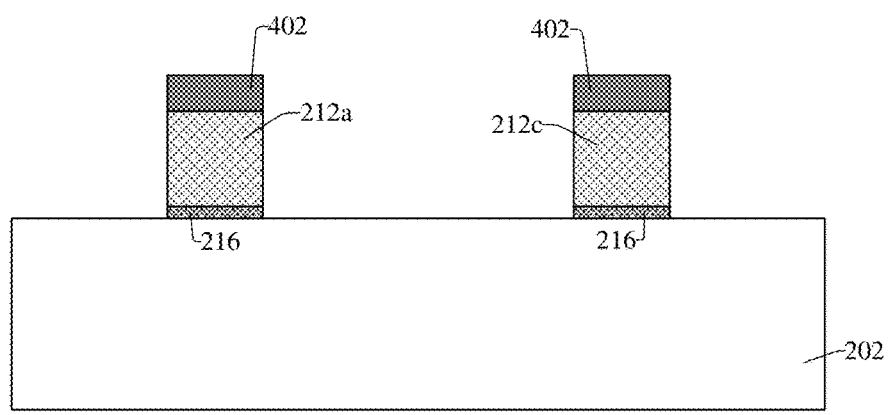

As shown in cross-sectional view 400 of FIG. 4, a first hard mask 402 is formed over the first gate layer (e.g., 302 of FIG. 3) and the first gate layer is patterned according to the first hard mask 402 to define a first gate 212a and a third gate 212c. The patterning also further defines the gate dielectric layer 216. In some embodiments, the first hard mask 402 may, for example, comprise silicon nitride, titanium nitride, or some other suitable material. In some embodiments, the patterning may comprise a dry etching process such as, for example, a reactive ion etching (RIE) process, an ion beam etching (IBE) process, some other plasma etching process, or some other suitable dry etching process.

Figure 5:
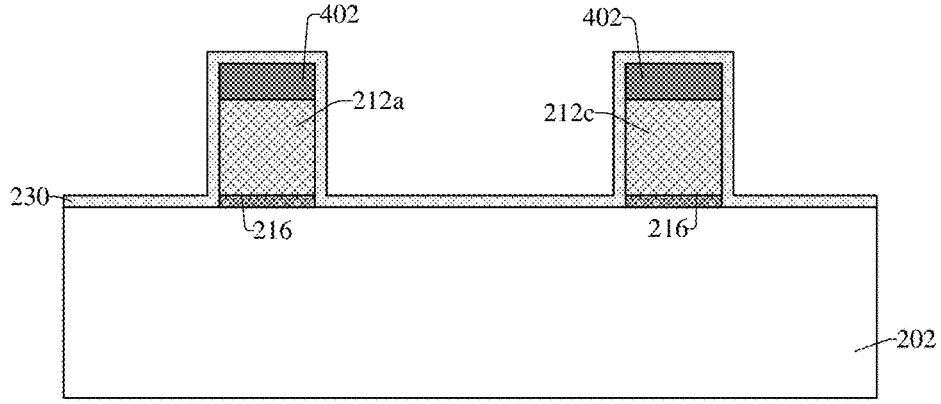

As shown in cross-sectional view 500 of FIG. 5, a first dielectric liner layer 230 is conformally formed over the substrate 202, over the first hard mask 402, on sidewalls of the first gate 212a, and on sidewalls of the third gate 212c. In some embodiments, the first dielectric liner layer 230 may, for example, be formed by depositing silicon dioxide, aluminum oxide, hafnium oxide, some other dielectric, or some other suitable material over the substrate 202 by a CVD process, a PVD process, an ALD process, a spin on process, or some other suitable process.

Figure 6:
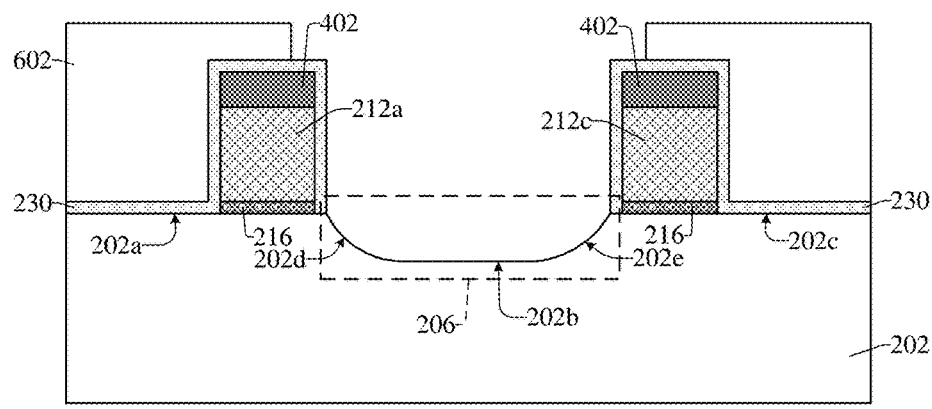

As shown in cross-sectional view 600 of FIG. 6, a photoresist mask 602 is formed over the substrate 202, over the first gate 212a, and over the third gate 212c, and the substrate 202 is patterned according to the photoresist mask 602 to form a common recess 206 in the substrate 202 between the first gate 212a and the third gate 212c. The common recess 206 is disposed between a first top surface 202a of the substrate 202 and a third top surface 202c of the substrate 202. Further, the common recess 206 is defined by a second top surface 202b of the substrate 202, a first connecting surface 202d of the substrate 202, and a second connecting surface 202e of the substrate 202. In some embodiments, the patterning may comprise a dry etching process such as, for example, a RIE process, an IBE process, some other plasma etching process, or some other suitable dry etching process.

Figure 7:
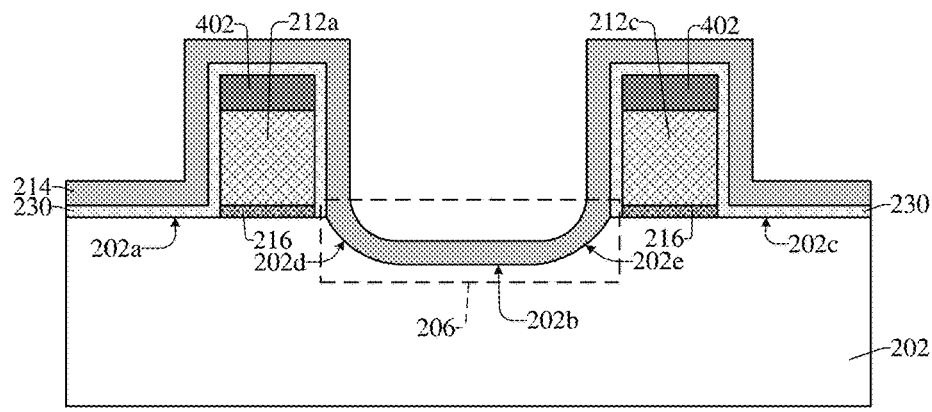

As shown in cross-sectional view 700 of FIG. 7, a charge trapping dielectric structure 214 is conformally formed over first dielectric liner layer 230, along sidewalls of the first gate 212a, along sidewalls of the second gate 212b, and over the common recess 206. In particular, the charge trapping dielectric structure 214 is formed over the first top surface 202a of the substrate 202, over the third top surface 202c of the substrate 202, on the first connecting surface 202d of the substrate 202, on the second connecting surface 202e of the substrate 202, and on the second top surface 202b of the substrate 202.

In some embodiments, the charge trapping dielectric structure 214 may, for example, be formed by depositing a tunneling layer (e.g., 215a of FIG. 2A) over the substrate 202, by depositing a charge trapping layer (e.g., 215b of FIG. 2A) over the tunneling layer, and by depositing a blocking layer (e.g., 215c of FIG. 2A) over the charge trapping layer. In some embodiments, the tunneling layer and/or the blocking layer may, for example, be formed by depositing silicon dioxide, aluminum oxide, hafnium oxide, some other dielectric, or some other suitable material over the substrate 202 by a CVD process, a PVD process, an ALD process, a spin on process, or some other suitable process. In some embodiments, the charge trapping layer may, for example, be formed by depositing silicon nitride, aluminum nitride, or some other suitable material over the substrate 202 by a CVD process, a PVD process, an ALD process, a spin on process, or some other suitable process.

Figure 8:
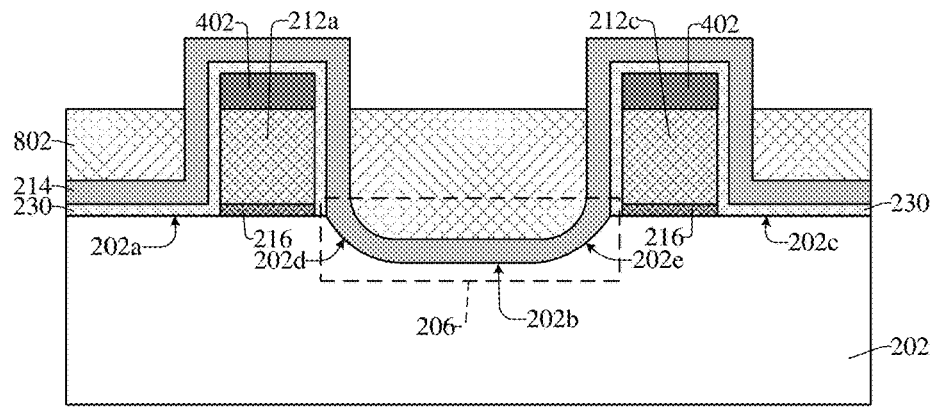

As shown in cross-sectional view 800 of FIG. 8, a second gate layer 802 is formed over the charge trapping dielectric structure 214, and the second gate layer 802 is subsequently etched back such that a top surface of the second gate layer 802 is below a top surface of the charge trapping dielectric structure 214. In some embodiments, the second gate layer 802 may, for example, be formed by depositing polysilicon or some other suitable material over the substrate 202 by a CVD process, a PVD process, an ALD process, or some other suitable process. In some embodiments, the etch back may, for example, comprise a dry etching process or some other suitable process.

Figure 9:
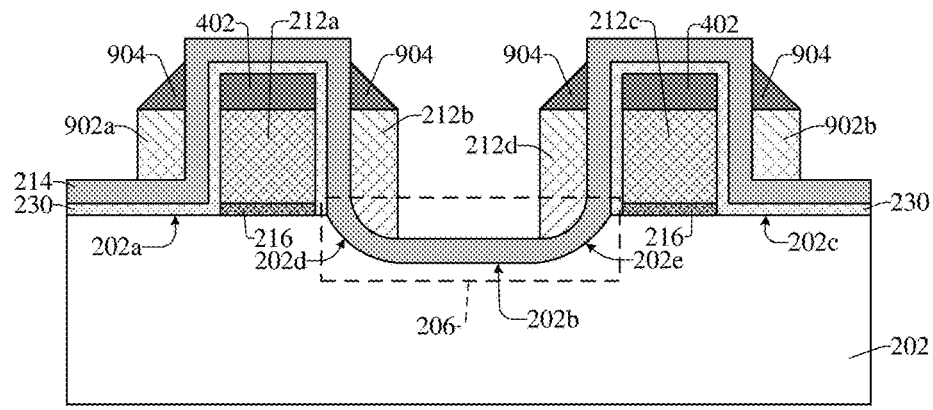

As shown in cross-sectional view 900 of FIG. 9, a second hard mask 904 is formed over the second gate layer (e.g., 802 of FIG. 8) on opposing sides of the first gate 212a and the third gate 212c, and the second gate layer is patterned according to the second hard mask 904 to define a second gate 212b, a fourth gate 212d, a first dummy gate 902a, and a second dummy gate 902b. The second hard mask 904 may, for example, comprise silicon nitride, titanium nitride, or some other suitable material. In some embodiments, the patterning may comprise a dry etching process such as, for example, a RIE process, an IBE process, some other plasma etching process, or some other suitable dry etching process.

Figure 10:
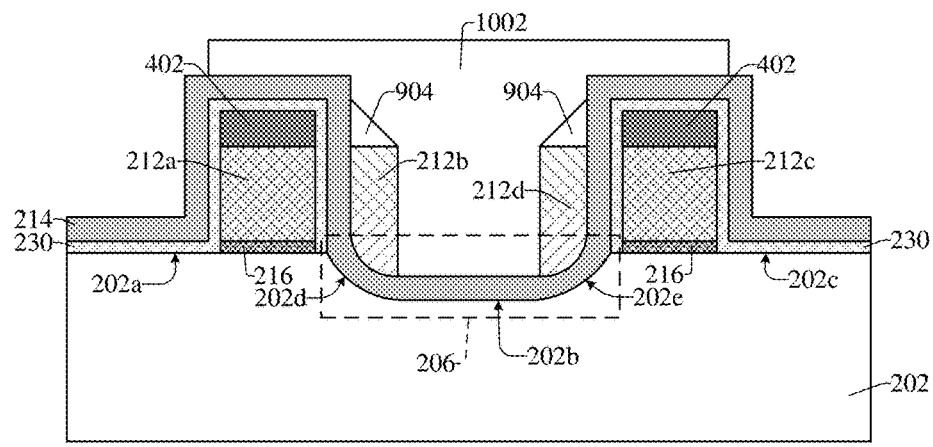

As shown in cross-sectional view 1000 of FIG. 10, the first dummy gate (e.g., 902a of FIG. 9) and the second dummy gate (e.g., 902b of FIG. 9) are removed. In some embodiments, removing the first dummy gate and the second dummy gate comprises forming a photoresist mask 1002 over the first gate 212a, the second gate 212b, the third gate 212c, and the fourth gate 212d, and etching the first dummy gate and the second dummy gate according to the photoresist mask 1002 to remove the first dummy gate and the second dummy gate from over the charge trapping dielectric structure 214. In some embodiments, the etching may comprise a dry etching process such as, for example, a RIE process, an IBE process, some other plasma etching process, or some other suitable dry etching process.

Figure 11:
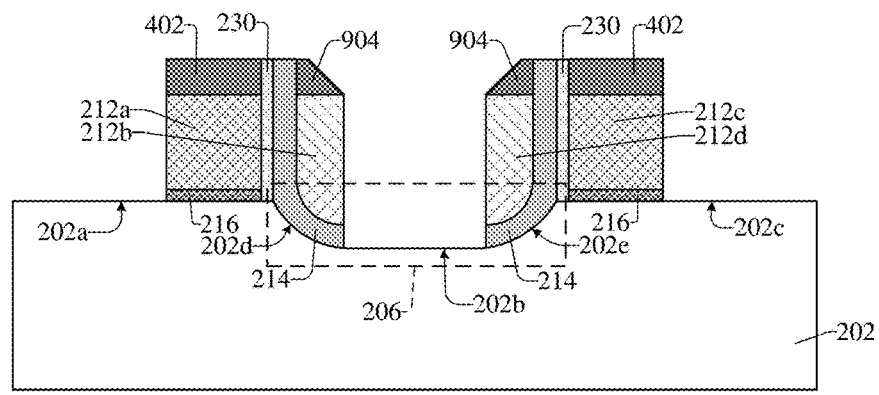

As shown in cross-sectional view 1100 of FIG. 11, the charge trapping dielectric structure 214 and the first dielectric liner layer 230 are patterned according to the first gate 212a, the second gate 212b, the third gate 212c, and the fourth gate 212d. The patterning removes the charge trapping dielectric structure 214 and the first dielectric liner layer 230 from the first top surface 202a of the substrate, from the third top surface 202c of the substrate 202, and from at least a portion of the second top surface 202b of the substrate 202. In some embodiments, the patterning may comprise a dry etching process such as, for example, a RIE process, an IBE process, some other plasma etching process, or some other suitable dry etching process.

Figure 12:
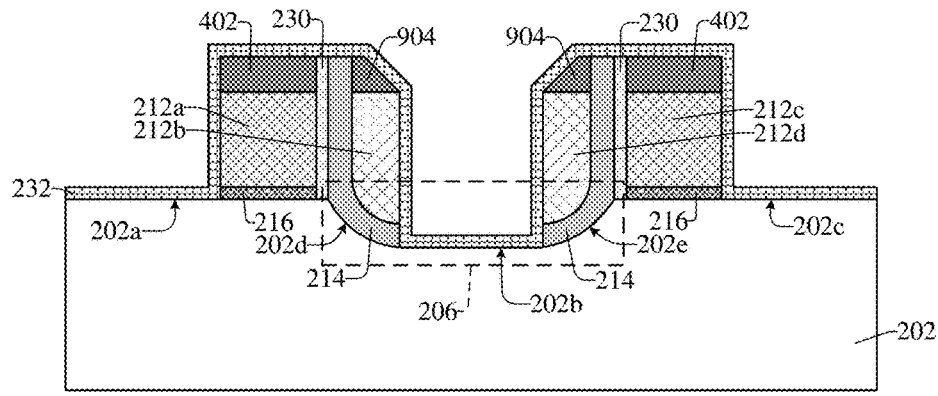

As shown in cross-sectional view 1200 of FIG. 12, a second dielectric liner layer 232 is conformally formed on the first top surface 202a of the substrate 202, on a sidewall of the first gate 212a, on a sidewall of the second gate 212b, on the second top surface 202b of the substrate 202, on a sidewall of the fourth gate 212d, on a sidewall of the third gate 212c, and on the third top surface 202c of the substrate 202. In some embodiments, the second dielectric liner layer 232 may, for example, be formed by depositing silicon dioxide, aluminum oxide, hafnium oxide, some other dielectric, or some other suitable material over the substrate 202 by a CVD process, a PVD process, an ALD process, a spin on process, or some other suitable process.

Figure 13:
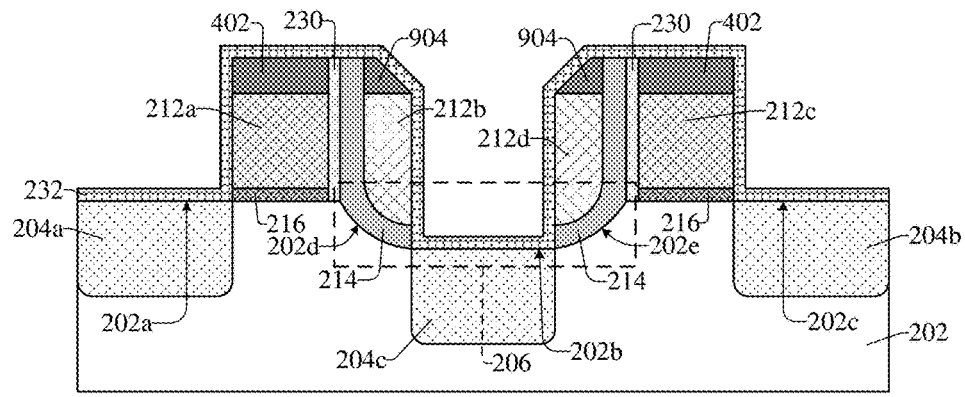

As shown in cross-sectional view 1300 of FIG. 13, a first individual source/drain region 204a and a second individual source/drain region 204b are formed in the substrate 202 along the first top surface 202a and the third top surface 202c, respectively, and adjacent to the first gate 212a and the third gate 212c, respectively. Further, a common source/drain region 204c is formed in the substrate 202 along the second top surface 202b of the substrate 202 and between the second gate 212b and the fourth gate 212d.

In some embodiments, the first individual source/drain region 204a, the second individual source/drain region 204b, and the common source/drain region 204c may, for example, be formed by an ion implantation process or some other suitable process.

Figure 14:
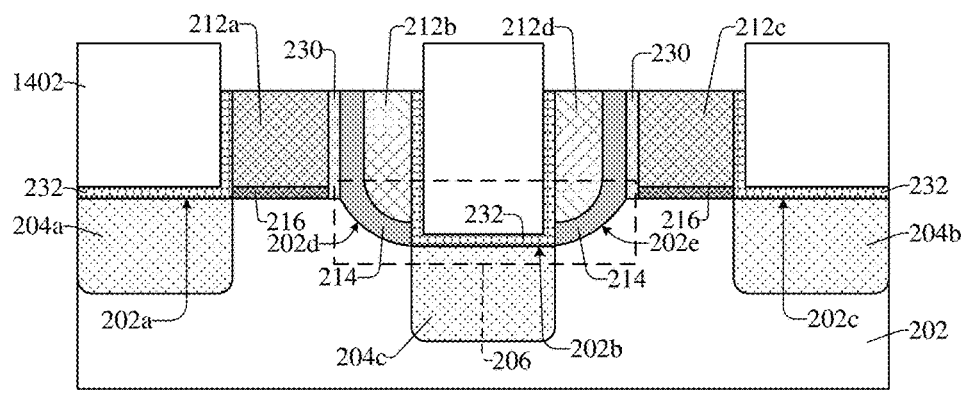

As shown in cross-sectional view 1400 of FIG. 14, the second dielectric liner layer 232, the first hard mask (e.g., 402 of FIG. 13), and the second hard mask (e.g., 904 of FIG. 13) are removed from over the first gate 212a, the second gate 212b, the third gate 212c, and the fourth gate 212d. In some embodiments, the removal may, for example, comprise a dry etching process or some other suitable process. For example, in some embodiments, the removal may comprise forming a photoresist mask 1402 over the substrate 202, and patterning the first hard mask and the second hard mask according to the photoresist mask 1402 to remove the second dielectric liner layer 232, the first hard mask, and the second hard mask. In some other embodiments, the removal may comprise a chemical mechanical planarization (CMP) process or some other suitable process.

Figure 15:
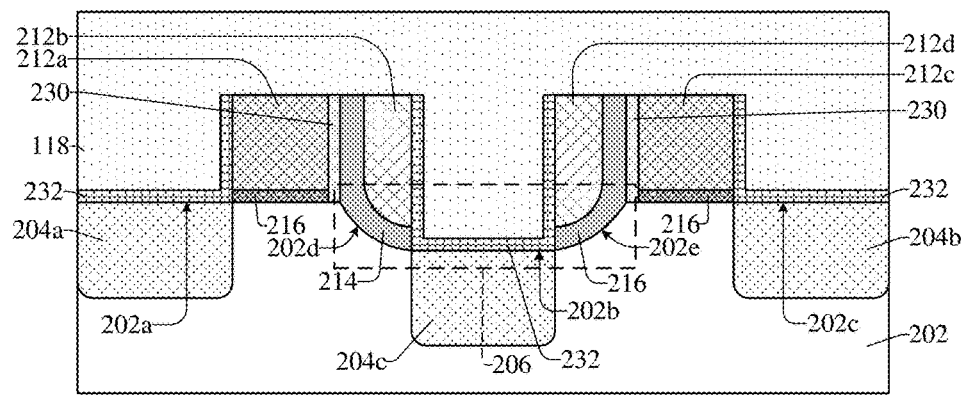

As shown in cross-sectional view 1500 of FIG. 15, a first interlayer dielectric (ILD) layer 118 is formed over the substrate 202, the first gate 212a, the second gate 212b, the third gate 212c, and the fourth gate 212d. In some embodiments, the first ILD layer 118 may, for example, be formed by depositing silicon dioxide, silicon oxynitride, silicon oxycarbide, or some other suitable material over the substrate 202 by a CVD process, a PVD process, an ALD process, a spin on process, or some other suitable process.

Figure 16:
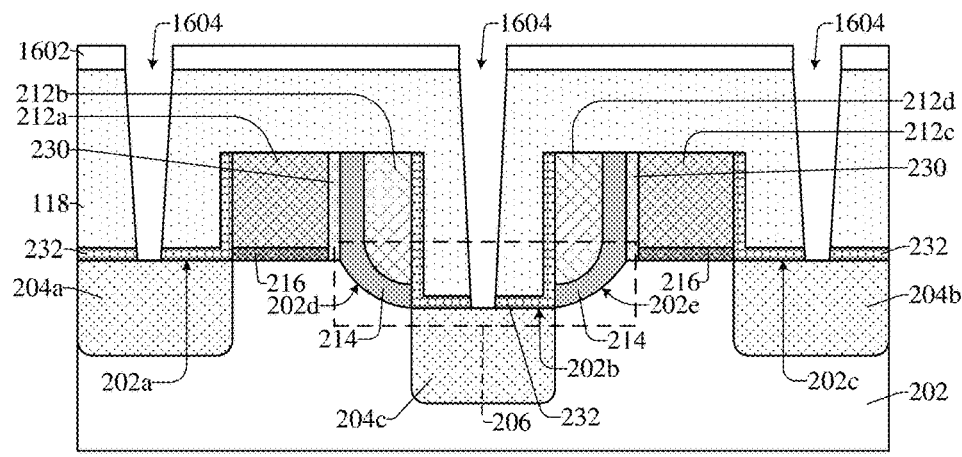

As shown in cross-sectional view 1600 of FIG. 16, a photoresist mask 1602 is formed over the first ILD layer 118 and the first ILD layer 118 is patterned according to the photoresist mask 1602 to form a plurality of contact openings 1604 in the first ILD layer 118. In some embodiments, the plurality of contact openings 1604 extend through the first ILD layer 118 and through the second dielectric liner layer 232 to the source/drain regions (e.g., 204a, 204b, 204c). In some embodiments, the patterning may, for example, comprise a dry etching process or some other suitable process.

Figure 17:
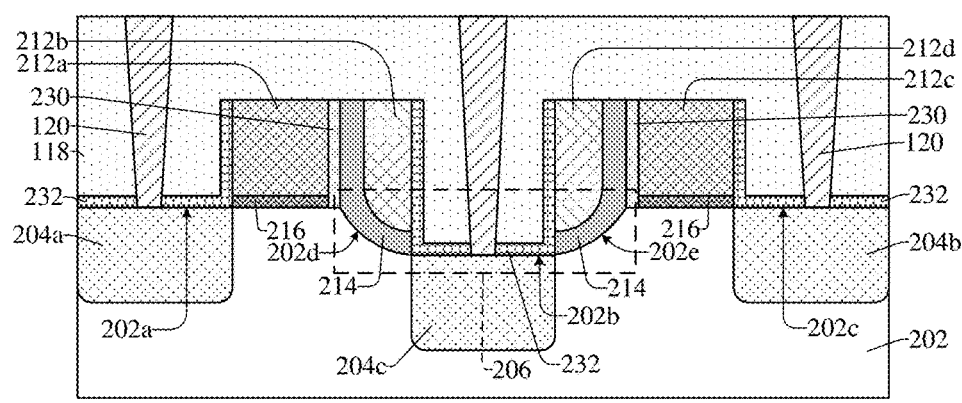

As shown in cross-sectional view 1700 of FIG. 17, a plurality of contacts 120 are formed in the plurality of contact openings (e.g., 1604 of FIG. 16). In some embodiments, the plurality of contacts 120 may, for example, be formed by depositing a metal (e.g., tungsten, copper, cobalt, or the like) in the contact openings by a sputtering process, an electrochemical deposition process, an electroless deposition process, or some other suitable process, and by subsequently planarizing the metal with a planarization process.

Figure 18:
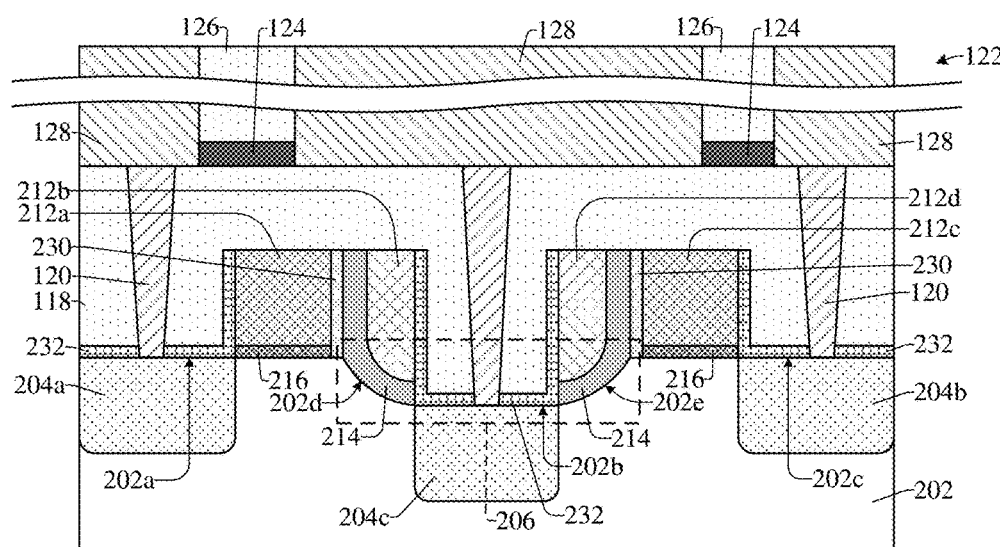

As shown in cross-sectional view 1800 of FIG. 18, an interconnect structure 122 is formed over the plurality of contacts 120. In some embodiments, the interconnect structure 122 may, for example, be formed by depositing an etch-stop layer 124 over the first ILD layer 118, depositing a second ILD layer 126 over the etch-stop layer 124, patterning the second ILD layer 126 to form openings in the second ILD layer 126, depositing a metal in the openings to form interconnect wires 128 in the openings, and planarizing the metal.

FIGS. 19-33 illustrate cross-sectional views 1900-3300 of some embodiments of a method for forming an integrated chip comprising gates (e.g., 212a, 212c) that are arranged over a first recess 206a and a second recess 206b in a substrate 202. Although FIGS. 19-33 are described in relation to a method, it will be appreciated that the structures disclosed in FIGS. 19-33 are not limited to such a method, but instead may stand alone as structures independent of the method.

Figure 19:
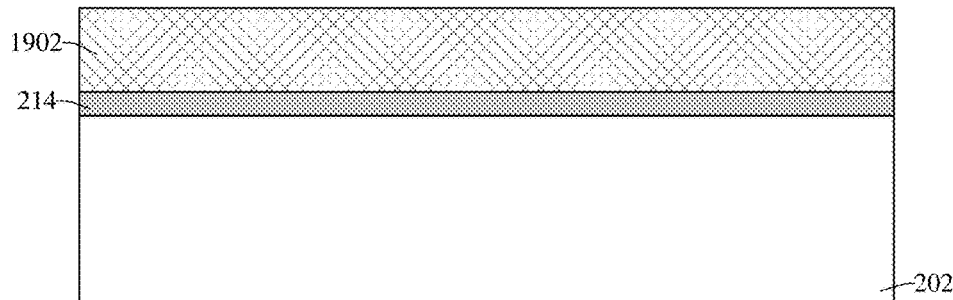
FIGS. 19-33 illustrate cross-sectional views of some embodiments of a method for forming an integrated chip comprising gates that are arranged over a first recess and a second recess in a substrate.

As shown in cross-sectional view 1900 of FIG. 19, a charge trapping dielectric structure 214 is formed over a substrate 202 and a first gate layer 1902 is formed over the charge trapping dielectric structure 214. In some embodiments, the charge trapping dielectric structure 214 may, for example, be formed by depositing a tunneling layer (e.g., 215a of FIG. 2B) over the substrate 202, by depositing a charge trapping layer (e.g., 215b of FIG. 2B) over the tunneling layer, and by depositing a blocking layer (e.g., 215c of FIG. 2B) over the charge trapping layer.

In some embodiments, the tunneling layer and/or the blocking layer may, for example, be formed by depositing silicon dioxide, aluminum oxide, hafnium oxide, some other dielectric, or some other suitable material over the substrate 202 by a CVD process, a PVD process, an ALD process, a spin on process, or some other suitable process. In some embodiments, the charge trapping layer may, for example, be formed by depositing silicon nitride, aluminum nitride, or some other suitable material over the substrate 202 by a CVD process, a PVD process, an ALD process, a spin on process, or some other suitable process.

In some embodiments, the first gate layer 1902 may, for example, be formed by depositing any of polysilicon or some other suitable material over the substrate 202 by a CVD process, a PVD process, an ALD process, or some other suitable process.

Figure 20:
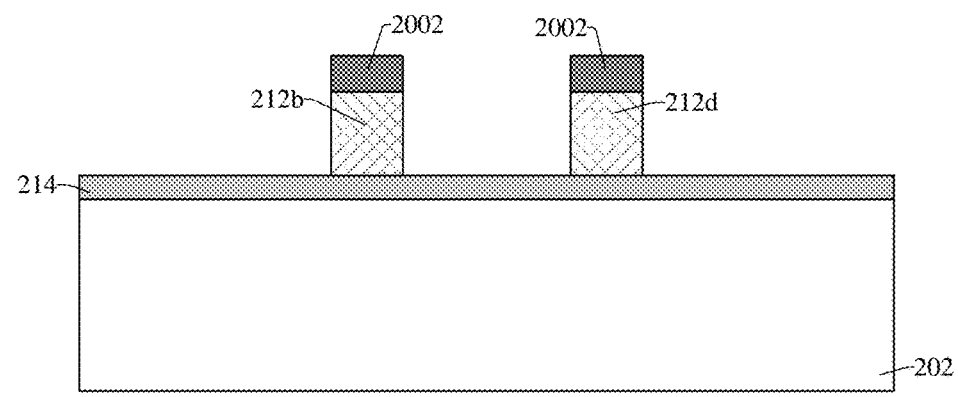

As shown in cross-sectional view 2000 of FIG. 20, a first hard mask 2002 is formed over the first gate layer (e.g., 1902 of FIG. 19) and the first gate layer is patterned according to the first hard mask 2002 to define a second gate 212b and a fourth gate 212d. In some embodiments, the first hard mask 2002 may, for example, comprise silicon nitride, titanium nitride, or some other suitable material. In some embodiments, the patterning may comprise a dry etching process such as, for example, a RIE process, an IBE process, some other plasma etching process, or some other suitable dry etching process.

Figure 21:
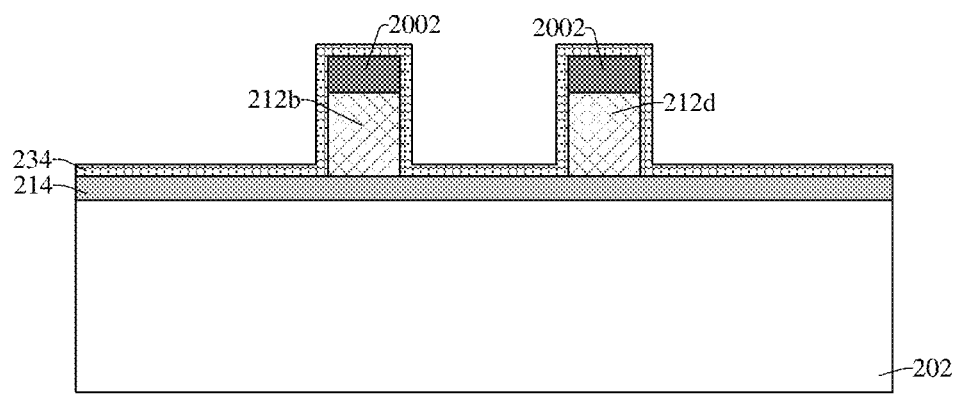

As shown in cross-sectional view 2100 of FIG. 21, a first dielectric liner layer 234 is conformally formed over the charge trapping dielectric structure 214, over the first hard mask 2002, on sidewalls of the second gate 212b, and on sidewalls of the fourth gate 212d. In some embodiments, the first dielectric liner layer 234 may, for example, be formed by depositing silicon dioxide, aluminum oxide, hafnium oxide, some other dielectric, or some other suitable material over the substrate 202 by a CVD process, a PVD process, an ALD process, a spin on process, or some other suitable process.

Figure 22:
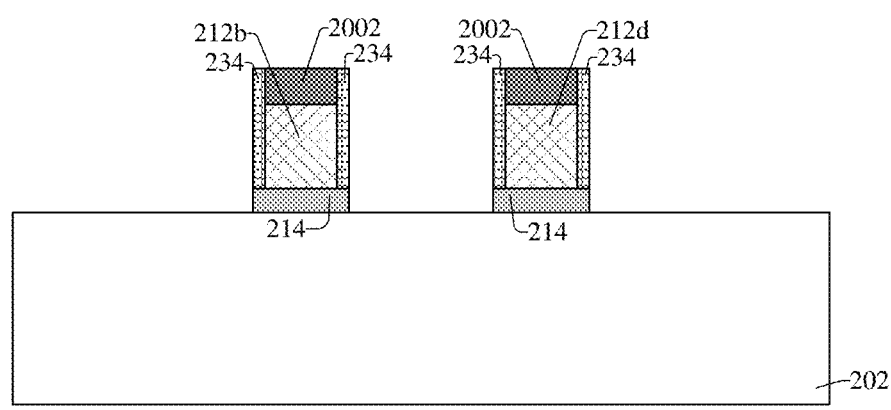

As shown in cross-sectional view 2200 of FIG. 22, the first dielectric liner layer 234 and the charge trapping dielectric structure 214 are patterned according to the second gate 212b and the fourth gate 212d. In some embodiments, the patterning removes the charge trapping dielectric structure 214 and the first dielectric liner layer 234 from portions of the substrate 202 that are not covered by the second gate 212b nor the fourth gate 212d. In some embodiments, the patterning may comprise a dry etching process such as, for example, a RIE process, an IBE process, some other plasma etching process, or some other suitable dry etching process. In some embodiments, the patterning may remove the first dielectric liner layer 234 from over the first hard mask 2002.

Figure 23:
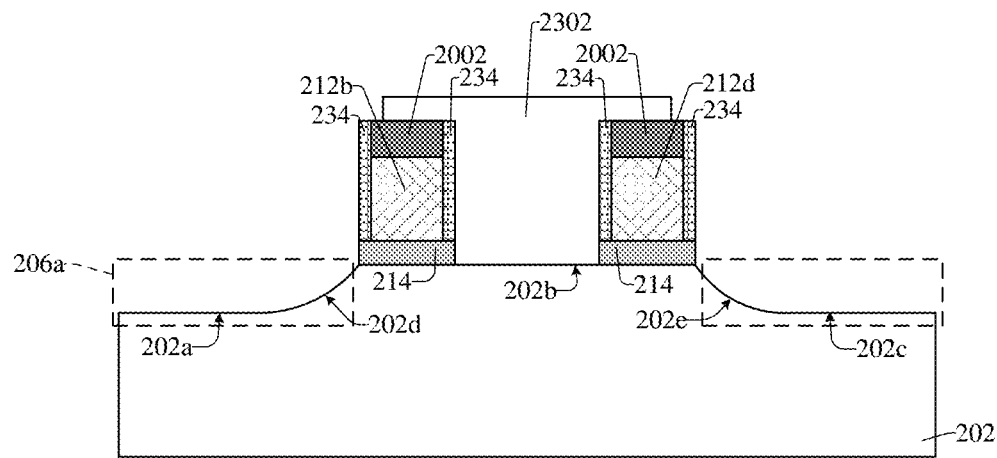

As shown in cross-sectional view 2300 of FIG. 23, a photoresist mask 2302 is formed over the substrate 202, over the second gate 212b, and over the fourth gate 212d, and the substrate 202 is patterned according to the photoresist mask 2302 to form a first recess 206a in the substrate 202 adjacent to the second gate 212b and to form a second recess 206b in the substrate 202 adjacent to the fourth gate 212d. The first recess 206a is defined by a first top surface 202a of the substrate 202 and a first connecting surface 202d of the substrate 202. The second recess 206b is defined by a third top surface 202c of the substrate 202 and a second connecting surface 202e of the substrate 202. A second top surface 202b of the substrate 202 laterally extends between the first connecting surface 202d and the second connecting surface 202e. In some embodiments, the patterning may comprise a dry etching process such as, for example, a RIE process, an IBE process, some other plasma etching process, or some other suitable dry etching process.

Figure 24:
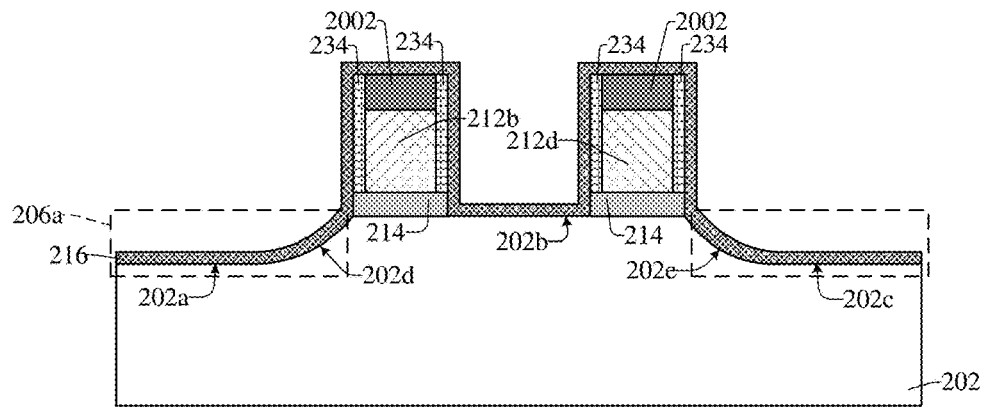

As shown in cross-sectional view 2400 of FIG. 24, a gate dielectric layer 216 is conformally formed over the first recess 206a, over the second recess 206b, along sidewalls of the second gate 212b, and along sidewalls of the fourth gate 212d. In particular, the gate dielectric layer 216 is formed on the first top surface 202a of the substrate 202, on the third top surface 202c of the substrate 202, on the first connecting surface 202d of the substrate 202, on the second connecting surface 202e of the substrate 202, and over the second top surface 202b of the substrate 202. In some embodiments, the gate dielectric layer 216 may, for example, be formed by depositing silicon dioxide, aluminum oxide, hafnium oxide, some other dielectric, or some other suitable material over the substrate 202 by a CVD process, a PVD process, an ALD process, a spin on process, or some other suitable process.

Figure 25:
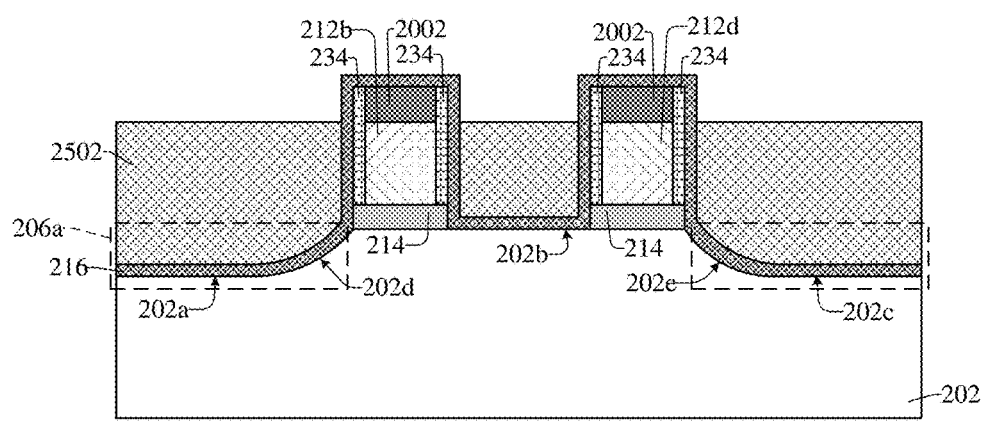

As shown in cross-sectional view 2500 of FIG. 25, a second gate layer 2502 is formed over the gate dielectric layer 216, and the second gate layer 2502 is subsequently etched back such that a top surface of the second gate layer 2502 is below a top surface of the gate dielectric layer 216. In some embodiments, the second gate layer 2502 may, for example, be formed by depositing polysilicon or some other suitable material over the substrate 202 by a CVD process, a PVD process, an ALD process, or some other suitable process. In some embodiments, the etch back may, for example, comprise a dry etching process or some other suitable process.

Figure 26:
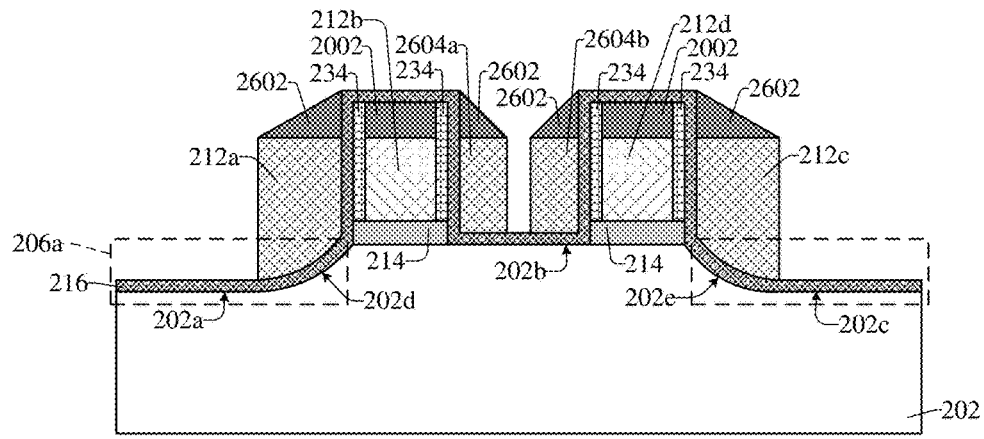

As shown in cross-sectional view 2600 of FIG. 26, a second hard mask 2602 is formed over the second gate layer (e.g., 2502 of FIG. 25) on opposing sides of the second gate 212b and the fourth gate 212d, and the second gate layer is patterned according to the second hard mask 2602 to define a first gate 212a, a third gate 212c, a first dummy gate 2604a, and a second dummy gate 2604b. The second hard mask 2602 may, for example, comprise silicon nitride, titanium nitride, or some other suitable material. In some embodiments, the patterning may comprise a dry etching process such as, for example, a RIE process, an IBE process, some other plasma etching process, or some other suitable dry etching process.

Figure 27:
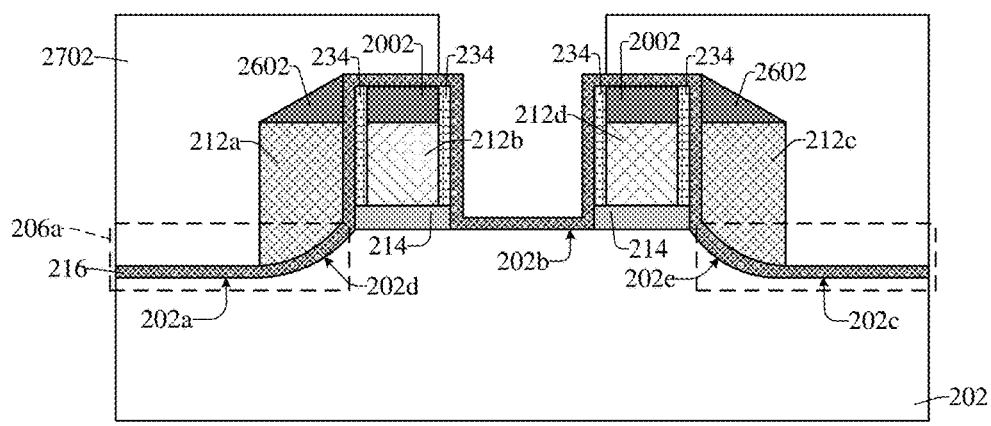

As shown in cross-sectional view 2700 of FIG. 27, the first dummy gate (e.g., 2604a of FIG. 26) and the second dummy gate (e.g., 2604b of FIG. 26) are removed. In some embodiments, removing the first dummy gate and the second dummy gate comprises forming a photoresist mask 2702 over the first gate 212a, the second gate 212b, the third gate 212c, and the fourth gate 212d, and etching the first dummy gate and the second dummy gate according to the photoresist mask 2702 to remove the first dummy gate and the second dummy gate from over the gate dielectric layer 216. In some embodiments, the etching may comprise a dry etching process such as, for example, a RIE process, an IBE process, some other plasma etching process, or some other suitable dry etching process.

Figure 28:
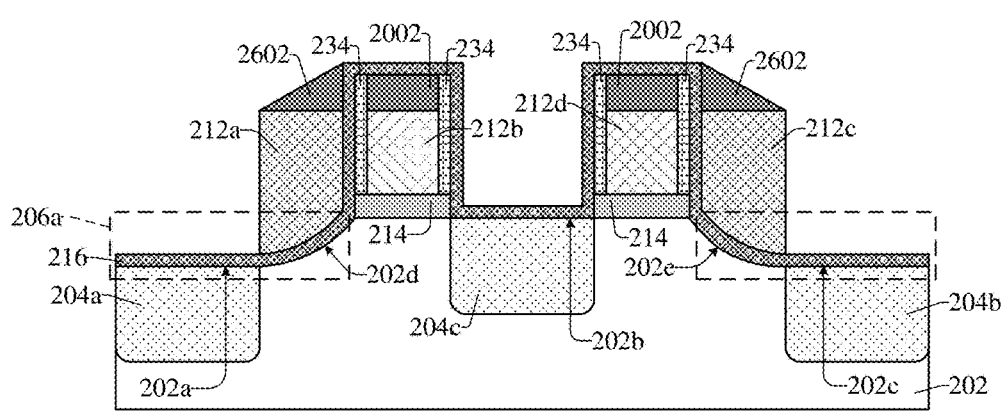

As shown in cross-sectional view 2800 of FIG. 28, a first individual source/drain region 204a and a second individual source/drain region 204b are formed in the substrate 202 along the first top surface 202a and the third top surface 202c, respectively, and adjacent to the first gate 212a and the third gate 212c, respectively. Further, a common source/drain region 204c is formed in the substrate 202 along the second top surface 202b of the substrate 202 and between the second gate 212b and the fourth gate 212d.

In some embodiments, the first individual source/drain region 204a, the second individual source/drain region 204b, and the common source/drain region 204c may, for example, be formed by an ion implantation process or some other suitable process.

Figure 29:
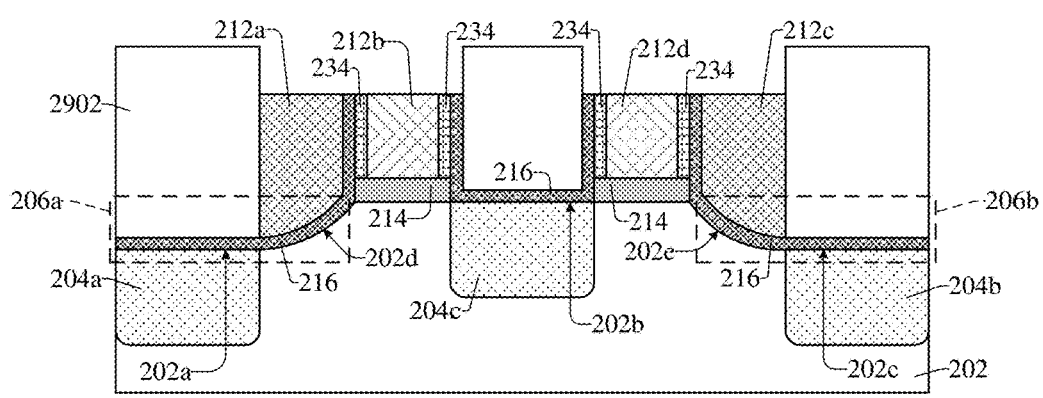

As shown in cross-sectional view 2900 of FIG. 29, the gate dielectric layer 216, the first hard mask (e.g., 2002 of FIG. 28), and the second hard mask (e.g., 2602 of FIG. 28) are removed from over the first gate 212a, the second gate 212b, the third gate 212c, and the fourth gate 212d. In some embodiments, the removal may, for example, comprise a dry etching process or some other suitable process. For example, in some embodiments, the removal may comprise forming a photoresist mask 2902 over the substrate 202, and patterning the first hard mask and the second hard mask according to the photoresist mask 2902 to remove the gate dielectric layer 216, the first hard mask, and the second hard mask. In some other embodiments, the removal may comprise a chemical mechanical planarization (CMP) process or some other suitable process.

Figure 30:
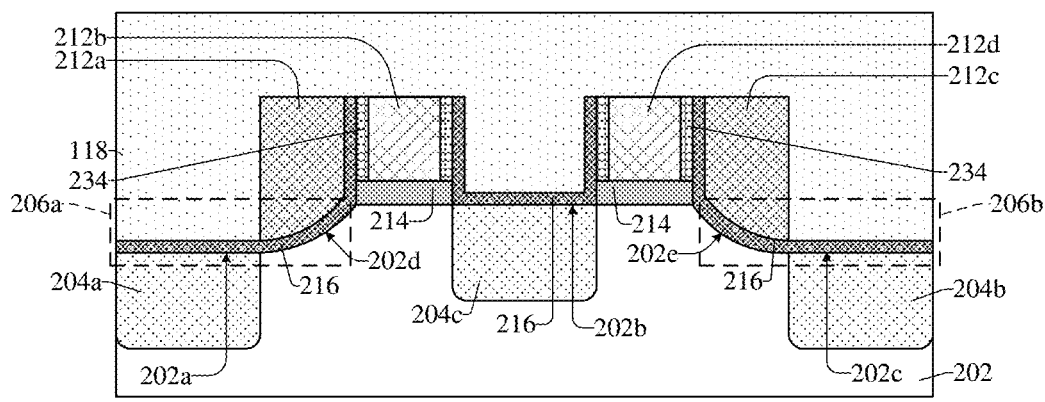

As shown in cross-sectional view 3000 of FIG. 30, a first interlayer dielectric (ILD) layer 118 is formed over the substrate 202, the first gate 212a, the second gate 212b, the third gate 212c, and the fourth gate 212d. In some embodiments, the first ILD layer 118 may, for example, be formed by depositing silicon dioxide, silicon oxynitride, silicon oxycarbide, or some other suitable material over the substrate 202 by a CVD process, a PVD process, an ALD process, a spin on process, or some other suitable process.

Figure 31:
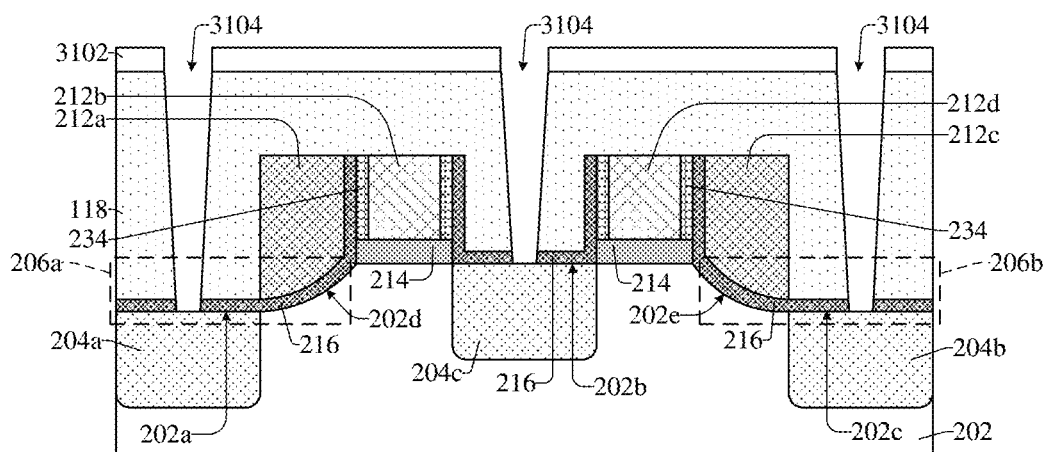

As shown in cross-sectional view 3100 of FIG. 31, a photoresist mask 3102 is formed over the first ILD layer 118 and the first ILD layer 118 is patterned according to the photoresist mask 3102 to form a plurality of contact openings 3104 in the first ILD layer 118. In some embodiments, the plurality of contact openings 3104 extend through the first ILD layer 118 and through the second dielectric liner layer 232 to the source/drain regions (e.g., 204a, 204b, 204c). In some embodiments, the patterning may, for example, comprise a dry etching process or some other suitable process.

Figure 32:
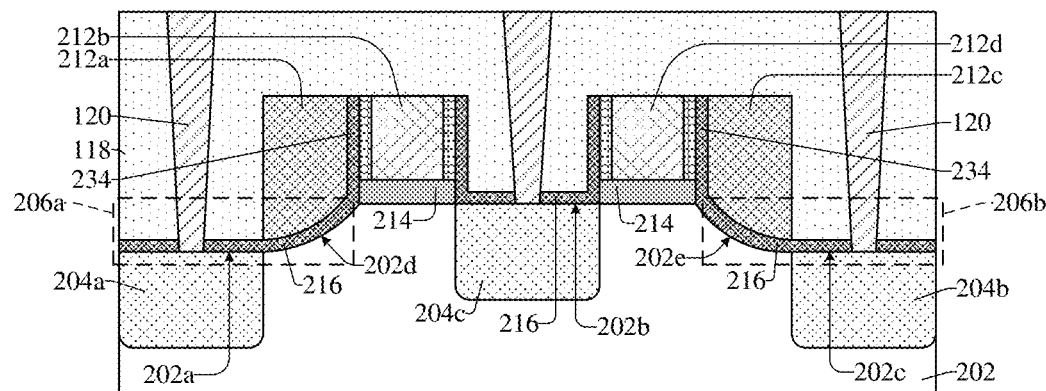

As shown in cross-sectional view 3200 of FIG. 32, a plurality of contacts 120 are formed in the plurality of contact openings (e.g., 3104 of FIG. 31). In some embodiments, the plurality of contacts 120 may, for example, be formed by depositing a metal (e.g., tungsten, copper, cobalt, or the like) in the contact openings by a sputtering process, an electrochemical deposition process, an electroless deposition process, or some other suitable process, and by subsequently planarizing the metal with a planarization process.

Figure 33:
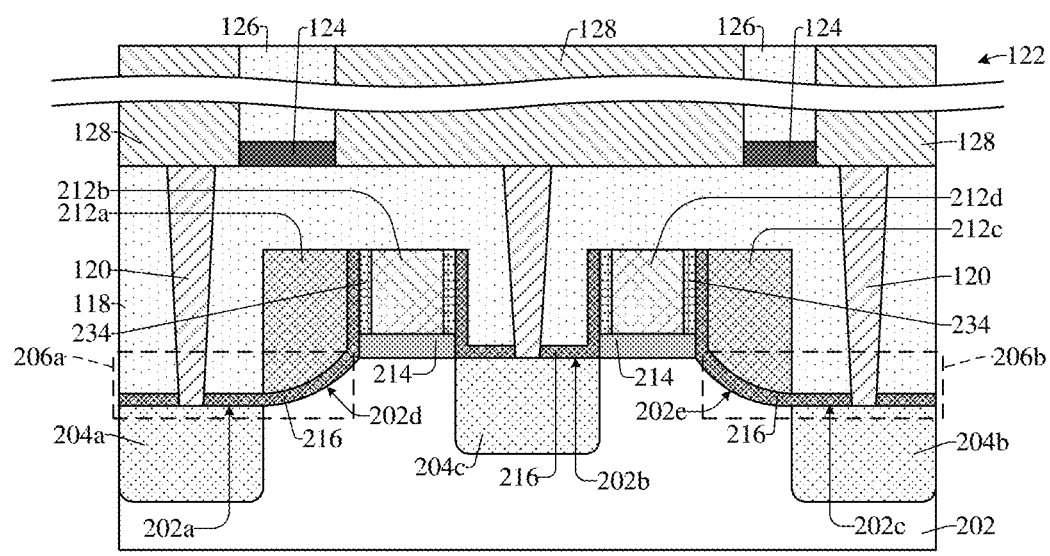

As shown in cross-sectional view 3300 of FIG. 33, an interconnect structure 122 is formed over the plurality of contacts 120. In some embodiments, the interconnect structure 122 may, for example, be formed by depositing an etch-stop layer 124 over the first ILD layer 118, depositing a second ILD layer 126 over the etch-stop layer 124, patterning the second ILD layer 126 to form openings in the second ILD layer 126, depositing a metal in the openings to form interconnect wires 128 in the openings, and planarizing the metal.

Figure 34:
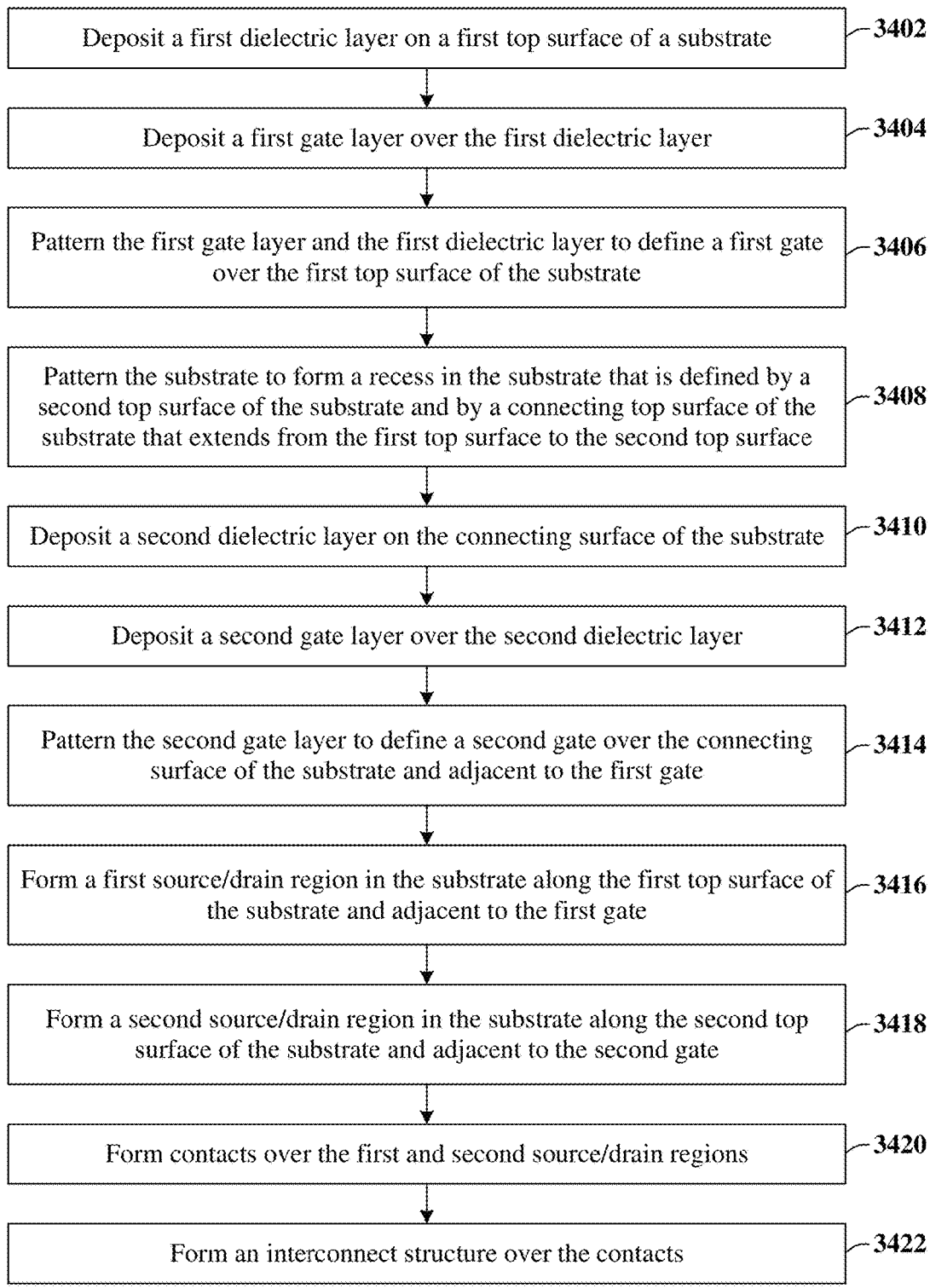
FIG. 34 illustrates a flow diagram of some embodiments of a method for forming an integrated chip comprising a gate structure that is arranged over a recess in a substrate.

FIG. 34 illustrates a flow diagram of some embodiments of a method 3400 for forming an integrated chip comprising a gate structure that is arranged over a recess in a substrate. While method 3400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 3402, a first dielectric layer is deposited on a first top surface of a substrate. FIGS. 3 and 19 illustrate cross-sectional views 300 and 1900, respectively, of some embodiments corresponding to act 3402.

At 3404, a first gate layer is deposited over the first dielectric layer. FIGS. 3 and 19 illustrate cross-sectional views 300 and 1900, respectively, of some embodiments corresponding to act 3404.

At 3406, the first gate layer and the first dielectric layer are patterned to define a first gate over the first top surface of the substrate. FIGS. 4, 20, and 22 illustrate cross-sectional views 400, 2000, and 2200, respectively, of some embodiments corresponding to act 3406.

At 3408, the substrate to is patterned form a recess in the substrate that is defined by a second top surface of the substrate and by a connecting top surface of the substrate that extends from the first top surface to the second top surface. FIGS. 6 and 23 illustrate cross-sectional views 600 and 2300, respectively, of some embodiments corresponding to act 3408.

At 3410, a second dielectric layer is deposited on the connecting surface of the substrate. FIGS. 7 and 24 illustrate cross-sectional views 700 and 2400, respectively, of some embodiments corresponding to act 3410.

At 3412, a second gate layer is deposited over the second dielectric layer. FIGS. 8 and 25 illustrate cross-sectional views 800 and 2500, respectively, of some embodiments corresponding to act 3412.

At 3414, the second gate layer is patterned to define a second gate over the connecting surface of the substrate and adjacent to the first gate. FIGS. 9 and 26 illustrate cross-sectional views 900 and 2600, respectively, of some embodiments corresponding to act 3414.

At 3416, a first source/drain region is formed in the substrate along the first top surface of the substrate and adjacent to the first gate. FIGS. 13 and 29 illustrate cross-sectional views 1300 and 2900, respectively, of some embodiments corresponding to act 3416.

At 3418, a second source/drain region is formed in the substrate along the second top surface of the substrate and adjacent to the second gate. FIGS. 13 and 29 illustrate cross-sectional views 1300 and 2900, respectively, of some embodiments corresponding to act 3418.

At 3420, contacts are formed over the first and second source/drain regions. FIGS. 17 and 32 illustrate cross-sectional views 1700 and 3200, respectively, of some embodiments corresponding to act 3420.

At 3422, an interconnect structure is formed over the contacts. FIGS. 18 and 33 illustrate cross-sectional views 1800 and 3300, respectively, of some embodiments corresponding to act 3422.

Thus, the present disclosure relates to an integrated chip including a memory cell that comprises a gate structure disposed over a recess in a substrate to increase a cell density of the integrated chip.

Accordingly, in some embodiments, the present disclosure relates to an integrated chip comprising a substrate having a first top surface disposed at a first height, a second top surface disposed at a second height that is less than the first height, and a connecting surface extending from the first top surface to the second top surface. A first source/drain region is disposed along the first top surface of the substrate.

A second source/drain region is disposed along the second top surface of the substrate and is laterally separated from the first source/drain region by a channel region of the substrate. A gate structure is arranged between the first source/drain region and the second source/drain region. The gate structure extends from over the first top surface of the substrate to over the connecting surface of the substrate. The gate structure also extends below the first top surface of the substrate.

In other embodiments, the present disclosure relates to an integrated chip comprising a substrate having a first top surface and a third top surface disposed at a first height, a second top surface laterally between the first and third top surfaces and disposed at a second height that is different than the first height, a first connecting surface extending from the first top surface to the second top surface, and second connecting surface extending from the third top surface to the second top surface. A first individual source/drain region is disposed along the first top surface of the substrate. A second individual source/drain region is disposed along the third top surface of the substrate. A common source/drain region is between the first and second individual source/drain regions and is disposed along the second top surface of the substrate. A first gate is over the first connecting surface and is between the first individual source/drain region and the common source/drain region. A second gate is adjacent to the first gate and is between the first individual source/drain region and the common source/drain region. A third gate is over the second connecting surface and is between the second individual source/drain region and the common source/drain region. A fourth gate is adjacent to the third gate and is between the second individual source/drain region and the common source/drain region. A horizontal plane that is disposed at a third height that is between the first height and the second height intersects both the first gate and the third gate.

In yet other embodiments, the present disclosure relates to a method for forming an integrated chip. The method comprises depositing a first gate layer over a first top surface of a substrate. The first gate layer is patterned to define a first gate over the first top surface. The substrate is patterned according to the first gate to form a first recess in the substrate that is adjacent to the first gate. The first recess is formed by both a second top surface of the substrate and a connecting surface of the substrate. A first dielectric layer is deposited on the connecting surface and the second top surface of the substrate. A second gate layer is deposited over the connecting surface and the second top surface of the substrate. The second gate layer is patterned to form a second gate over the connecting surface and adjacent to the first gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:
    depositing a first gate layer over a first top surface of a substrate;
    patterning the first gate layer to define a first gate over the first top surface;
    patterning the substrate according to the first gate to form a first recess in the substrate that is adjacent to the first gate, wherein the first recess is formed by both a second top surface of the substrate and a connecting surface of the substrate;
    depositing a first dielectric layer on the connecting surface and the second top surface of the substrate;
    depositing a second gate layer over the connecting surface and the second top surface of the substrate;
    patterning the second gate layer to form a second gate over the connecting surface and adjacent to the first gate; and
    depositing a second dielectric layer over the first top surface of the substrate before depositing the first gate layer.

2. The method of claim 1, further comprising:
    forming a first source/drain region in the substrate along the first top surface of the substrate and forming a second source/drain region in the substrate along the second top surface of the substrate after patterning the second gate layer.

3. The method of claim 1, wherein patterning the second gate layer removes the second gate layer from over a portion of the first top surface of the substrate.

4. The method of claim 1, wherein the first dielectric layer extends between the first gate and the second gate, and between the second gate and the substrate.

5. The method of claim 1, wherein the second gate extends from above the first top surface to below the first top surface.

6. The method of claim 1, wherein patterning the second gate layer forms a dummy gate over the first top surface and adjacent to the first gate, and wherein the method further comprises:
    removing the dummy gate from over the substrate.

7. The method of claim 1, further comprising:
    forming a dielectric liner layer over the substrate and along the first gate after the patterning of the first gate layer and before the patterning of the substrate.

8. A method for forming an integrated chip, the method comprising:
    depositing a gate dielectric layer over a semiconductor substrate;
    depositing a first gate layer over the gate dielectric layer;
    patterning the first gate layer to form a first gate and a third gate over the semiconductor substrate;
    patterning the semiconductor substrate to form a common recess in the semiconductor substrate and between the first gate and the third gate, wherein the semiconductor substrate has a first top surface, a second top surface, a third top surface, a first connecting surface, and a second connecting surface after the patterning of the semiconductor substrate, wherein the second top surface is between the first top surface and the third top surface, wherein the first connecting surface extends from the first top surface to the second top surface and the second connecting surface extends from the third top surface to the second top surface, wherein the first gate is over the first top surface and the third gate is over the third top surface, and wherein the common recess is formed by the second top surface, the first connecting surface, and the second connecting surface;

forming a charge trapping dielectric structure along the second top surface, the first connecting surface, the second connecting surface, a sidewall of the first gate, and a sidewall of the third gate;

depositing a second gate layer over the charge trapping dielectric structure, the first top surface, the second top surface, the third top surface, the first connecting surface, and the second connecting surface; and patterning the second gate layer to form a second gate and a fourth gate over the common recess, wherein the second gate is adjacent to the first gate and the fourth gate is adjacent to the third gate.

9. The method of claim 8, further comprising:

patterning the gate dielectric layer according to the first gate and the third gate; and patterning the charge trapping dielectric structure to delimit a first portion and a second portion of the charge trapping dielectric structure, wherein the first portion is separate from the second portion, wherein the first portion extends along the sidewall of the first gate, a sidewall of the second gate, and the first connecting surface, and wherein the second portion extends along the sidewall of the third gate, a sidewall of the fourth gate, and the second connecting surface.

10. The method of claim 9, wherein the patterning of the charge trapping dielectric structure removes the charge trapping dielectric structure from directly over the first top surface and the third top surface, and further removes the charge trapping dielectric structure from over a portion of the second top surface.

11. The method of claim 8, wherein the second gate is over the first connecting surface and separated from the first gate by a first portion of the charge trapping dielectric structure, and wherein the fourth gate is over the second connecting surface and separated from the third gate by a second portion of the charge trapping dielectric structure.

12. The method of claim 8, wherein the patterning of the second gate layer further forms a first dummy gate over the first top surface and adjacent to the first gate, and a second dummy gate over the third top surface and adjacent to the third gate, and wherein the method further comprises:

removing the first dummy gate and the second dummy gate from over the semiconductor substrate.

13. The method of claim 8, further comprising:

forming a dielectric liner layer along the first top surface, the first gate, the second gate, the second top surface, the third gate, the fourth gate, and the third top surface after the patterning of the second gate layer.

14. The method of claim 8, further comprising:

forming a dielectric liner layer along the semiconductor substrate, the first gate, the third gate, and the gate dielectric layer after the patterning of the first gate layer and before the patterning of the semiconductor substrate.

15. The method of claim 8, wherein forming the charge trapping dielectric structure comprises depositing a tunneling layer over the semiconductor substrate, depositing a charge trapping layer over the tunneling layer, and depositing a blocking layer over the charge trapping layer.

16. A method for forming an integrated chip, the method comprising:

forming a charge trapping dielectric structure over a semiconductor substrate;

depositing a first gate layer over the charge trapping dielectric structure;

patterning the first gate layer to form a second gate and a fourth gate over the semiconductor substrate;

patterning the semiconductor substrate to form a first recess in the semiconductor substrate and adjacent to the second gate, and to form a second recess, separate from the first recess, in the semiconductor substrate and adjacent to the fourth gate, wherein the semiconductor substrate has a first top surface, a second top surface, a third top surface, a first connecting surface, and a second connecting surface after the patterning of the semiconductor substrate, wherein the second top surface is between the first top surface and the third top surface, wherein the first connecting surface extends from the first top surface to the second top surface and the second connecting surface extends from the third top surface to the second top surface, wherein the second gate and the fourth gate are over the second top surface, wherein the first recess is formed by the first top surface and the first connecting surface, and wherein the second recess is formed by the third top surface and the second connecting surface;

depositing a gate dielectric layer along the first top surface, the first connecting surface, a sidewall of the second gate, the third top surface, the second connecting surface, and a sidewall of the fourth gate;

depositing a second gate layer over the gate dielectric layer, the first top surface, the second top surface, the third top surface, the first connecting surface, and the second connecting surface; and patterning the second gate layer to form a first gate over the first recess and a third gate over the second recess, wherein the first gate is adjacent to the second gate and the third gate is adjacent to the fourth gate.

17. The method of claim 16, wherein the first gate is over the first connecting surface and separated from the second gate by a first portion of the gate dielectric layer, and wherein the third gate is over the second connecting surface and separated from the third gate by a second portion of the gate dielectric layer.

18. The method of claim 16, further comprising:

forming a dielectric liner layer along the charge trapping dielectric structure, the second gate, and the fourth gate after the patterning of the first gate layer and before the patterning of the semiconductor substrate.

19. The method of claim 18, further comprising:

patterning the charge trapping dielectric structure and the dielectric liner layer according to the second gate and the fourth gate before the patterning of the semiconductor substrate.

20. The method of claim 1, further comprising:

depositing the first dielectric layer along a sidewall of the first gate, wherein the second gate layer is deposited directly over the first dielectric layer and along a sidewall of the first dielectric layer.

* * * * *